US011942966B2

(12) United States Patent
Boehm et al.

(10) Patent No.: US 11,942,966 B2
(45) Date of Patent: Mar. 26, 2024

(54) MANAGING ERROR CONTROL INFORMATION USING A REGISTER

(71) Applicant: Micron Technology, Inc., Boise, ID (US)

(72) Inventors: Aaron P. Boehm, Boise, ID (US); Scott E. Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/816,320

(22) Filed: Jul. 29, 2022

(65) Prior Publication Data
US 2023/0062939 A1 Mar. 2, 2023

Related U.S. Application Data

(60) Provisional application No. 63/234,068, filed on Aug. 17, 2021.

(51) Int. Cl.
*H03M 13/00* (2006.01)
*G06F 11/07* (2006.01)
*H03M 13/15* (2006.01)

(52) U.S. Cl.
CPC ......... *H03M 13/159* (2013.01); *G06F 11/073* (2013.01); *G06F 11/0787* (2013.01); *H03M 13/611* (2013.01)

(58) Field of Classification Search
CPC . H03M 13/159; H03M 13/611; G06F 11/073; G06F 11/0787
See application file for complete search history.

(56) References Cited

U.S. PATENT DOCUMENTS

| | | | | |
|---|---|---|---|---|
| 6,754,871 B1* | 6/2004 | Pines | .................. | H03M 13/175 714/761 |
| 7,231,579 B1* | 6/2007 | Pines | .................. | H03M 13/175 714/761 |
| 8,281,188 B2* | 10/2012 | Miller | ..................... | G06F 11/10 719/327 |
| 9,043,674 B2* | 5/2015 | Wu | ..................... | H03M 13/616 714/761 |
| 9,760,435 B2* | 9/2017 | Das | ..................... | G06F 11/1048 |
| 10,210,040 B2* | 2/2019 | Circello | ............ | H03M 13/2927 |
| 10,725,841 B1* | 7/2020 | Rahul | ................ | H03M 13/618 |
| 10,761,927 B2* | 9/2020 | Lu | ..................... | H03M 13/3738 |
| 11,392,454 B2* | 7/2022 | Kim | ..................... | H03M 13/05 |
| 11,614,869 B2* | 3/2023 | Kim | .................. | G11C 29/4401 711/154 |

* cited by examiner

*Primary Examiner* — Esaw T Abraham
(74) *Attorney, Agent, or Firm* — Holland & Hart LLP

(57) ABSTRACT

Methods, systems, and devices for managing error control information using a register are described. A memory device may store, at a register, an indication of whether the memory device has detected an error included in or otherwise associated with data requested from a host device. The memory device may determine to store the indication based on whether a communication protocol is enabled or disabled, and whether an error control configuration is enabled or disabled. The host device may request information from the register of the memory device, and the memory device may output the indication of whether the error was detected in response to the request.

19 Claims, 9 Drawing Sheets

MANAGING ERROR CONTROL INFORMATION USING A REGISTER

CROSS REFERENCE

The present Application for Patent claims the benefit of U.S. Provisional Patent Application No. 63/234,068 by BOEHM et al., entitled "MANAGING ERROR CONTROL INFORMATION USING A REGISTER," filed Aug. 17, 2021, assigned to the assignee hereof, and expressly incorporated by reference herein.

FIELD OF TECHNOLOGY

The following relates generally to one or more systems for memory and more specifically to managing error control information using a register.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
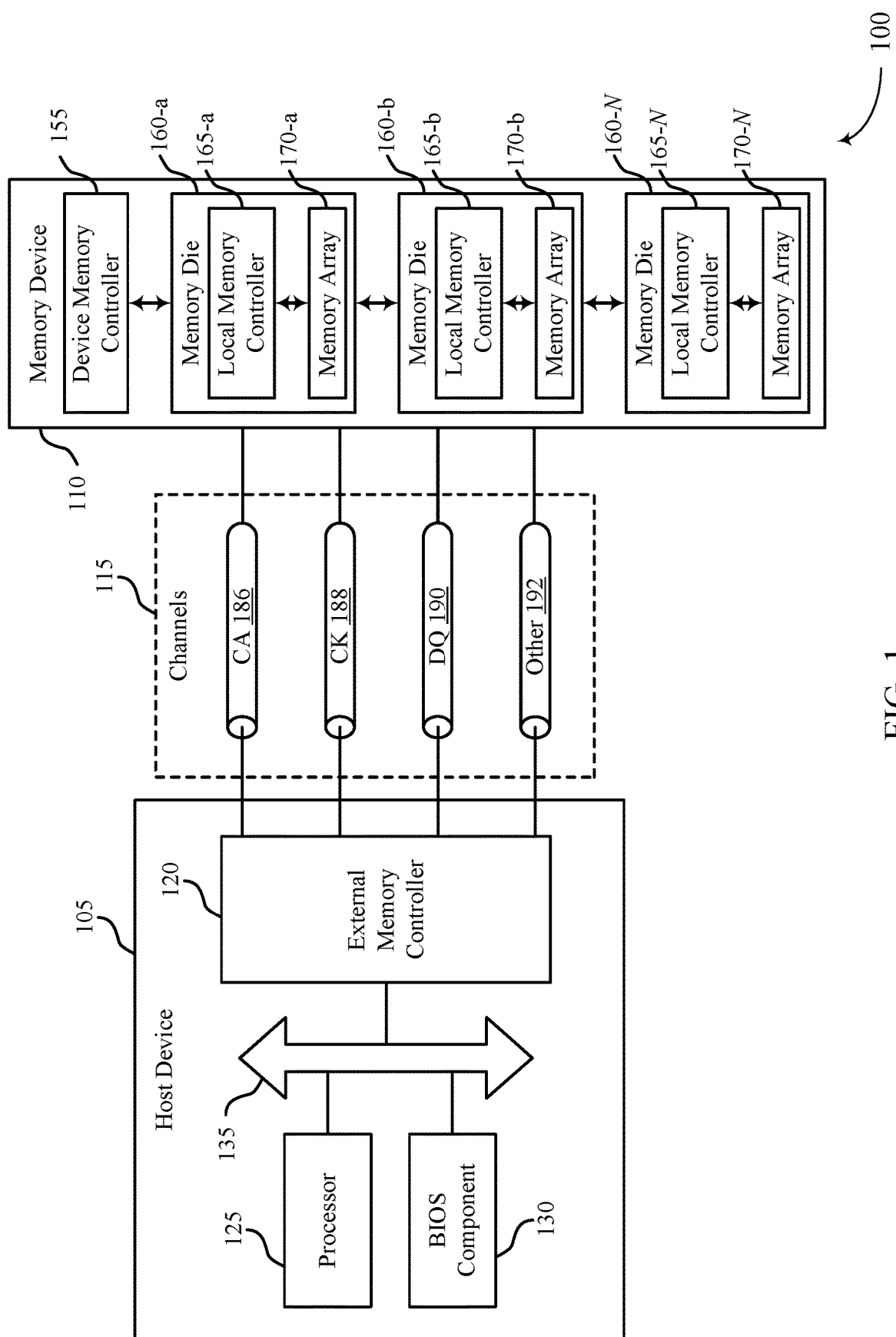
FIG. 1 illustrates an example of a system that supports managing error control information using a register in accordance with examples as disclosed herein.

Memory devices may use error detection and/or correction techniques (e.g., error control techniques) to increase a reliability of stored or communicated data. Some error control techniques used at memory devices may include single-bit error (SBE) correction (SEC) techniques, double-bit error (DBE) detection (DED) techniques, and SECDED techniques. In some cases, an external device that stores data at a memory device (e.g., a host device) may also use internal error control techniques to confirm the reliability of data received from the memory device.

In some cases, the error control techniques used at a memory device may differ from those used at a host device. For example, a host device may use a more robust error control technique than a memory device. In some scenarios, the use of different error control techniques at the host device versus the memory device may result in additional errors. For example, if a memory device applies an SEC technique to data that includes two or more bit errors, the memory device may improperly flip a correct bit of the data, which may increase the quantity of errors in the data from two bit errors to three bit errors. In such cases, a host device using SECDED techniques may be unable to detect and/or correctly identify the bit errors in received data when the memory device transmits the data with three bit errors, while the host device may have been able to detect the two original bit errors (e.g., without the additional error introduced by the memory device).

The present disclosure provides techniques to increase the reliability of data transferred between a memory device and host device. For example, the memory device may store, at a register (e.g., a mode register) of the memory device, an indication of whether the memory device has detected an error associated with error control operation using one or more syndrome bits associated with the error control operation. The memory device may store the indication in the register, which, for example, may be accessed by the host device. The memory device may determine to store the indication based on multiple criteria. For example, the memory device may determine that a communication protocol (e.g., a DSF+ protocol) for reporting information (e.g., error correction code (ECC) information, syndrome check information) to the host device is disabled, and that an error control configuration is enabled (e.g., a configuration for reporting the indication of the detected error). The memory device may store the indication of the detected error at the mode register based on the determination that the communication protocol for reporting information to the host device is disabled and that the error control configuration is enabled. The host device may request data from the mode register of the memory device and the memory device may output the indication of whether the error was detected in response to the poll. By accessing the indication of whether an error was detected at the memory device, the host device may avoid using data that includes a quantity of errors that would otherwise exceed the capability of the technique used by the host device—e.g., a host device using SECDED techniques may avoid using data that includes three-bit errors.

Features of the disclosure are initially described in the context of a memory system. Features of the disclosure are further described herein in the context of syndrome match checkers and memory subsystems that support coordinated error correction. These and other features of the disclosure are further illustrated by and described with reference to apparatus diagrams, system diagrams, and flowcharts that relate to coordinated error correction. Although the disclosure generally describes a DRAM system, the techniques described herein may be applicable to any memory system that implements error control or detection/correction techniques.

FIG. 1 illustrates an example of a system 100 that supports managing error control information using a register in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105. In some examples, the host device 105 may use an error correction technique. The host device 105 may request data from (e.g., poll) a register of the memory device 110. The host device 105 may access an indication of whether an error was detected at the memory device 110 and avoid using data that includes a quantity of errors that would otherwise exceed the capability of the error correction technique used by the host device.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The memory device 110 may support an internal (e.g., on-die) error control scheme configured to detect and in at least some cases correct errors in data read from a memory array 170 and communicated to a host device 105. Further, the memory device 110 may indicate to the host device 105 whether the error control scheme at the memory device 110 has detected an error associated with a set of data (e.g., by storing the indication so that the host device 105 may later poll the memory device 110 for the indication or the memory device 110 may later include the indication in an error report). For example, the memory device 110 may store the indication at a register of the memory device. Although FIG. 1 generally illustrates a DRAM system, the techniques described herein with reference to FIG. 1 may be applicable to any memory system that implements error control techniques (e.g., such as NAND, FeRAM, RRAM, or other memory technologies).

Figure 2:
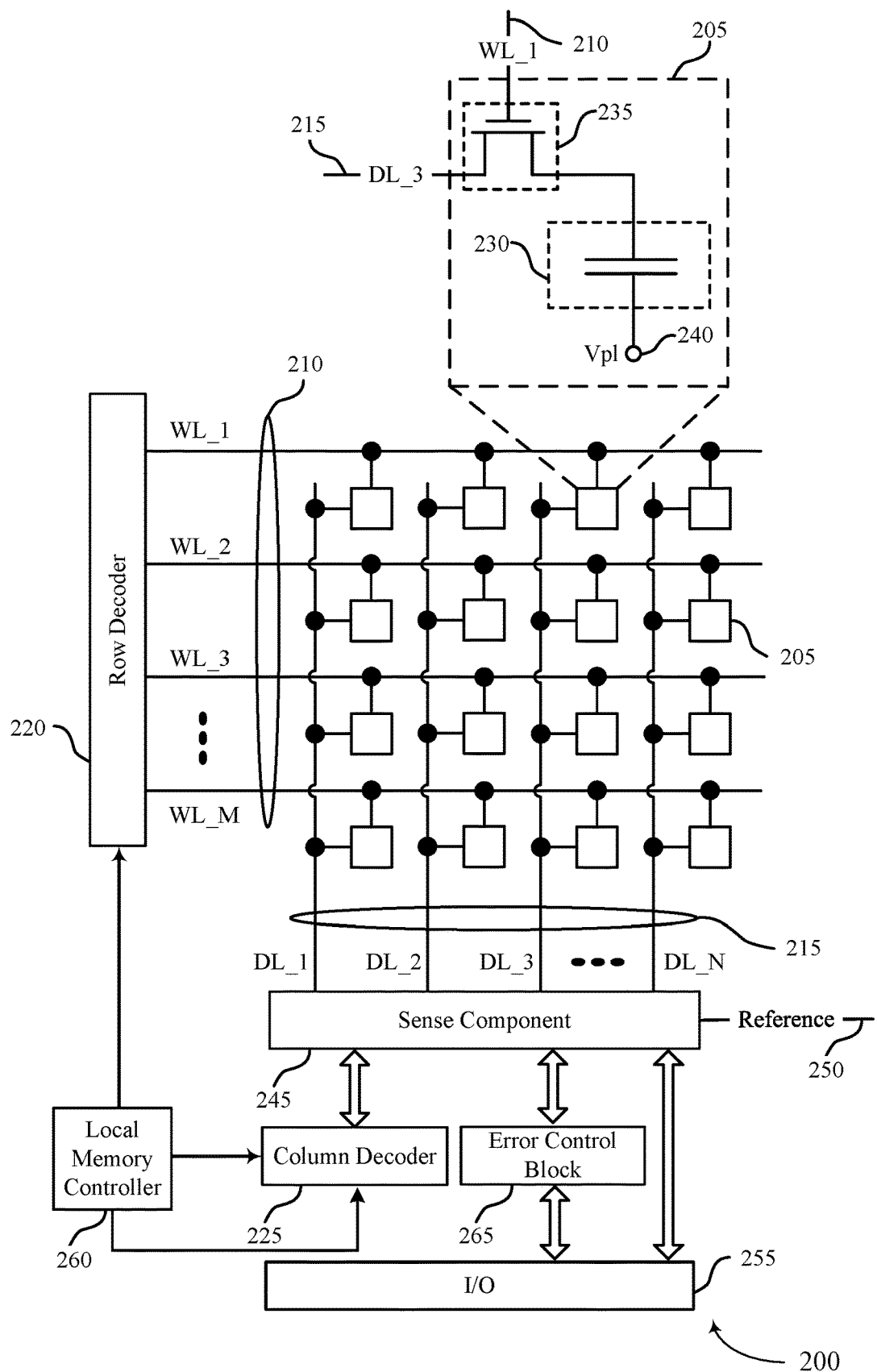
FIG. 2 illustrates an example of a memory die that supports managing error control information using a register in accordance with examples as disclosed herein.

FIG. 2 illustrates an example of a memory die 200 that supports managing error control information using a register in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The sense component 245 may include various transistors or amplifiers to detect and amplify a difference in the signals. The detected logic state of memory cell 205 may be output through an error control block 265 (e.g., ECC block, error control circuitry, or ECC circuitry) by I/O 255. The error control block 265 may perform an error correction operation on the detected logic state of memory cell 205 and output data (e.g., the stored data or corrected data) via I/O 255. In some other cases, the detected logic state of memory cell 205 may bypass error control block 265 and be output via I/O 255. In some cases, the detected logic state of memory cell 205 may be output to both the error control block 265 and the I/O 255. Here, the detected logic state of memory cell 205 may be output from the memory die 200 by the I/O 255 at a same time as error control block 265 performs an error correction operation on the detected logic state of memory cell 205. In some cases, the sense component 245 may be part of another component (e.g., a column decoder 225, row decoder 220). In some cases, the sense component 245 may be in electronic communication with the row decoder 220 or the column decoder 225.

The error control block 265 may output error control information, which may represent information used to detect and/or correct errors introduced while data is stored at the memory die 200. The error control information may include, for example, ECC information or parity bits, which may indicate whether an error exists in a set of associated data. Additionally or alternatively, the error control information may include syndrome check information (e.g., as described with reference to FIGS. 3 and 4). The syndrome check information may represent a probability or likelihood that an error exists in a set of data and/or the ECC information, based on a comparison of a set of syndromes. The syndromes may represent an intermediary result in an error detection or error correction process, and may be used by the error control block 265 to estimate (e.g., determine a probability of) whether an error has occurred in the set of data and/or the ECC information.

The local memory controller 260 may control the operation of memory cells 205 through the various components (e.g., row decoder 220, column decoder 225, sense component 245, and error control block 265). The local memory controller 260 may be an example of the local memory controller 165 described with reference to FIG. 1. In some cases, one or more of the row decoder 220, column decoder 225, sense component 245, and error control block 265 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

During the write operation, the error control block 265 or the local memory controller 260 may generate error detection or correction information. For example, the error control block 265 may receive data from the host device as part of a write operation. The error control block 265 may determine or generate error detection or correction information associated with the data. In some cases, the error control block 265 may include error detection logic or may cause error detection logic (not shown) to perform the error detection operations described herein. The error control block 265 may cause the data and the error detection or correction information to be stored in one or more memory cells 205 as part of the write operation. The type of error detection or correction information generated by the error control block 265 may correspond to a type of error detection operation performed by the error control block 265. For example, if the error control block 265 performs a SEC or SECDED error detection operation, the error control block 265 may generate a SEC or SECDED codeword as part of the write operation. The SEC or SECDED codewords may correspond to error detection information used by the error control block 265 to detect and/or correct errors within the data when performing a SEC or SECDED error detection operation respectively. Alternatively, if the error control block 265 performs an error detection operation based on parity bits, the error control block 265 may generate parity bits as part of the write operation.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

During the read operation, the error control block 265 may retrieve data and associated error detection or correction information from the array of memory cells 205. The error control block 265 may perform an error correction operation based on the data and the error detection or correction information. Performing an error correction operation at the memory device (e.g., by the error control block 265 or the local memory controller 260) may improve the reliability of the memory device. The error control block 265 may be configured to perform a single type of error detection operation (e.g., a SEC or SECDED error detection operation, an error detection operation based on parity bits) or may be configured to perform a combination of error detection operations (e.g., an error detection operation based on parity bits and a SEC or SECDED error detection operation).

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The memory die 200 may support an internal (e.g., on-die) error control scheme configured to detect and in at least some cases correct errors in data read from a memory array 170, as described with reference to FIG. 1. In some cases, the error control scheme may be implemented by the error control block 265 or some other on-die error control component (e.g., implemented by error control circuitry or ECC component). Further, the memory die 200 may indicate to a host device whether the error control scheme at the memory die 200 has detected an error associated with a set of data (e.g., by storing the indication so that the host device may poll the memory die 200 for the indication or so that the memory die 200 may include the indication in an error report). For example, the memory die 200 may store the indication at a register of the memory device. Although FIG. 2 generally illustrates a DRAM system, the techniques described herein with reference to FIG. 2 may be applicable to any memory system that implements error control techniques.

Figure 3:
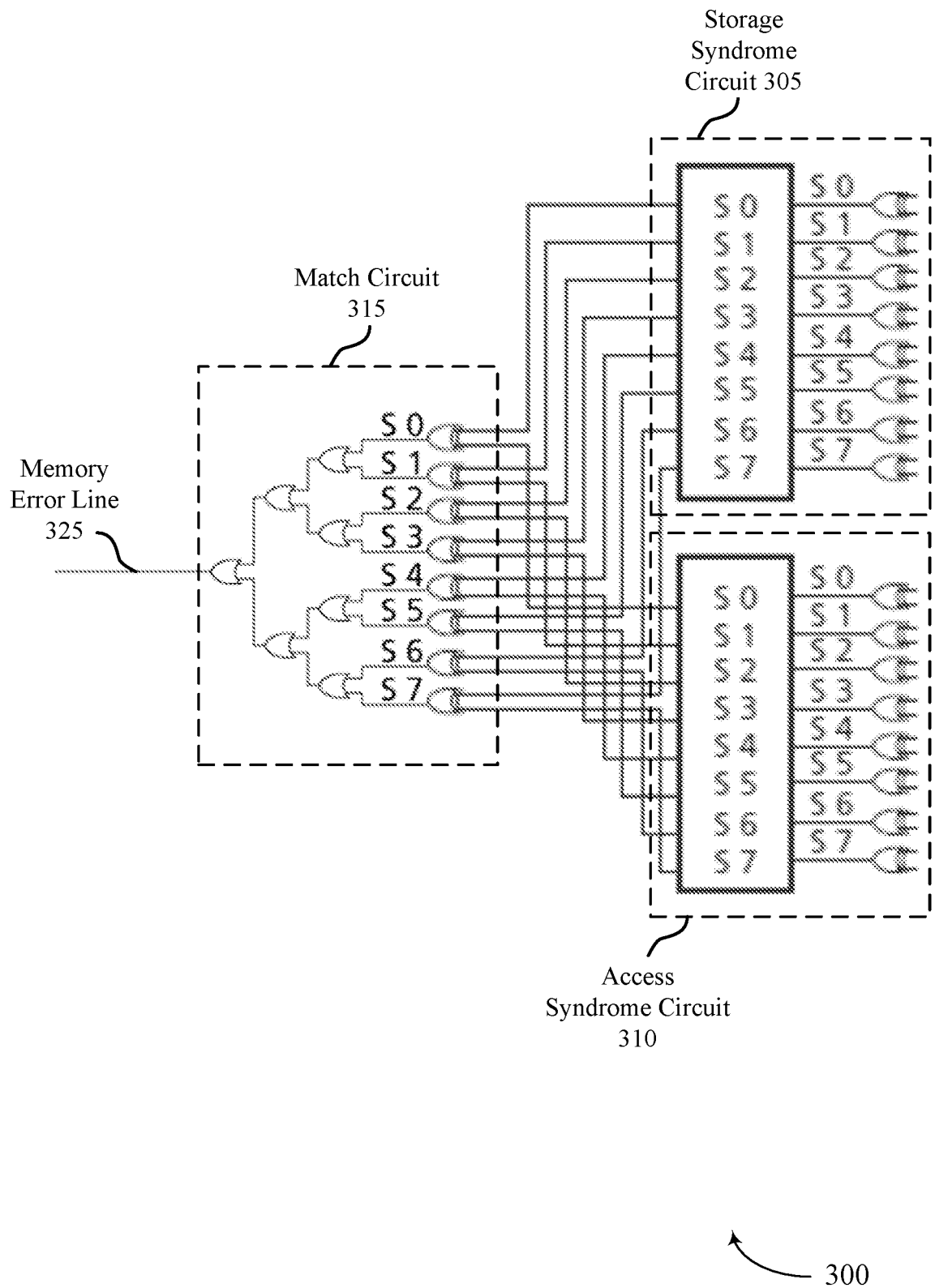
FIG. 3 illustrates an example of error control circuitry that supports managing error control information using a register in accordance with examples as disclosed herein.

FIG. 3 illustrates an example of error control circuitry 300 that supports managing error control information using a register in accordance with examples as disclosed herein. The error control circuitry 300 may be included in a memory device and may be configured to determine and indicate whether an on-die error control component (e.g., match circuit 315) detects an error associated with data stored in a memory array (e.g., an error in the data, or an error in parity bits associated with the data) and requested by a host device.

Error control circuitry 300 may be configured to detect errors in data stored in a memory cell. In some cases, error control circuitry 300 (e.g., or another component of the memory device) may also be configured to correct errors in data by flipping a data bit that has been identified as being corrupted—e.g., changing a corrupted data bit from a "1" to a "0," or vice versa. In some cases, error control circuitry 300 may be configured to detect SBEs in requested data and to correct SBEs in requested data—e.g., error control circuitry 300 may be configured to use an SEC technique. In some other cases, error control circuitry 300 may be configured to detect DBE and to correct SBEs in requested data—e.g., error control circuitry 300 may be configured to use a SECDED technique.

In other cases, error control circuitry 300 may be configured to detect triple-bit errors (TBEs). The examples described herein are merely illustrative, and error control circuitry 300 may be configured to detect up to any first quantity of errors and correct up to any second quantity of errors (that may be different than or the same as the first quantity). Error control circuitry 300 may be further configured to provide altered data—e.g., after performing one or more error correction techniques on the data—to an external device (e.g., a host device). The techniques described herein may be applied to an ECC scheme configured to detect and/or correct any quantity of errors, and any specific quantities used herein are purely for the sake of illustration and are non-limiting.

Error control circuitry 300 may include a storage syndrome circuit 305, an access syndrome circuit 310, and a match circuit 315. When error control circuitry 300 is configured to detect DBEs, storage syndrome circuit 305, access syndrome circuit 310, and match circuit 315 may each be configured to output an additional syndrome bit compared to when error control circuitry 300 is configured to implement an SEC scheme.

Storage syndrome circuit 305 may be configured to generate one or more syndromes (e.g., an ECC) for data before storage of the data within a memory array. In some cases, the syndrome(s) generated by storage syndrome circuit 305 may be referred to as a "stored ECC," "stored syndromes," or stored "codeword." Access syndrome circuit 310 may be configured to generate one or more other syndromes (e.g., another ECC) after data is read from the memory array—e.g., when the data stored in the memory array is requested by an external device. The syndrome(s) generated by access syndrome circuit 310 may be referred to as a "calculated ECC," "calculated syndromes," or "calculated codeword." In some cases, access syndrome circuit 310 may use a same algorithm as storage syndrome circuit 305 to generate the calculated syndrome(s).

Match circuit 315 may be configured to compare the stored syndrome(s) and the calculated syndrome(s). In some cases, match circuit 315 may compare the stored and calculated syndromes by performing exclusive or (XOR) operations on the corresponding bits of the stored and calculated syndromes. If each bit of the stored and calculated syndromes is the same—e.g., if the stored and calculated syndromes match—match circuit 315 may output all zeros. Otherwise, if the stored and calculated syndromes do not match, match circuit 315 may output one or more non-zero values (e.g., may output a respective non-zero value for each syndrome value or ECC value that does not match).

In some cases, match circuit 315 may also be configured to output a location of a corrupted bit in a set of data or in an associated stored syndrome based on the comparison of the stored syndrome(s) and the calculated syndrome(s). For example, when match circuit 315 outputs a non-zero value, each output of match circuit may be used to represent a position of a respective bit in the stored codeword that is identified by the memory device as being corrupted—e.g., the outputs of match circuit 315 may represent up to 256 different bit positions. Error match circuit 315 may be configured to indicate whether match circuit 315 detected an error in or otherwise associated with data requested from the memory array.

In some cases, if the output of match circuit 315 includes all zero values, match circuit 315 may output a first signal (e.g., a virtual ground voltage) that indicates a match (or a "match signal"). And if the output of match circuit 315 includes one or more non-zero values, match circuit 315 may output a second signal (e.g., a supply voltage) that indicates a mismatch (or a "mismatch signal").

In some cases, match circuit 315 outputs a Boolean "false" when match circuit 315 outputs all zero values (which may be represented by a virtual ground supply voltage), indicating a match. And if the output of match circuit includes at least one non-zero value, match circuit 315 outputs a Boolean "true", indicating a mismatch.

In other cases, if the output of match circuit 315 includes all zero values or less than some threshold quantity of non-zero values (e.g., includes a single non-zero value), match circuit 315 outputs a "false," indicating a match or substantial match. In some cases, one or some other quantity of non-zero values below a threshold quantity may indicate that an error occurred in the syndrome bits and not in the stored data. And if the output of match circuit 315 includes a quantity of non-zero values that satisfies the threshold (e.g., two or more), match circuit 315 outputs as "true", indicating a mismatch. In some cases, error control circuitry 300 may overwrite the stored syndrome(s) with the calculated syndrome(s) after identifying that one non-zero value was output by match circuit 315 and the corresponding data may be transmitted to a device that requested the data.

The output of match circuit 315 may be signaled over memory error line 325. In some cases, the output of match circuit 315 is signaled over memory error line 325 as a "memory syndrome flag." In some cases, memory error line 325 may transmit an output of match circuit, as a memory syndrome flag, to a register (e.g. a mode register), which may be accessible to one or more external devices. The output of the match circuit may be stored at the register and accessed when requested (e.g., polled) by an external device (e.g., a host device). For example, the memory device may receive a command from a host device for reading information stored at the register (e.g., a register read command). The memory device may output the information (e.g., at least some information) stored at the register based on the command. In other cases, the data stored at the register may be provided to an external device during some error reporting procedures.

In some examples, when the error control scheme supported by error control circuitry 300 is overpowered by data including more bit errors than a maximum quantity that the error control scheme can detect or correct, error control circuitry 300 may improperly alias (e.g., flip or otherwise alter) a bit having a correct value or otherwise introduce or fail to correct an error in a set of data read from the memory array. For example, when error control circuitry 300 is configured with an SEC scheme, error control circuitry 300 may detect an SBE in requested data that actually includes two or more bit errors. In such cases, error control circuitry 300 may unsuccessfully attempt to correct the detected error by flipping an uncorrupted bit in the requested data at a bit position indicated by match circuit 315—e.g., turning a two-bit error into a three bit error (which may be referred to as "aliasing"). In some cases, error control circuitry 300 may provide the altered data to an external device (e.g., a host device) that requested the data.

When error control circuitry 300 causes aliasing of data requested from a device, the external device (e.g., a host device) may be prevented from detecting errors in requested data that otherwise would have been detectable by the external device—e.g., an external device using a SECDED scheme that would have detected a DBE in requested data may be unable to reliably detect the TBE in the requested data caused by error control circuitry 300. By identifying and indicating that error control circuitry 300 detected and attempted to correct an error (e.g., as indicated and stored by the memory device in the register), the external device may determine whether the memory device detected an error, attempted to correct an error, or otherwise whether aliasing may have occurred as a result of an attempted correction by error control circuitry 300, as discussed in more detail herein and with respect to FIG. 4.

Figure 4:
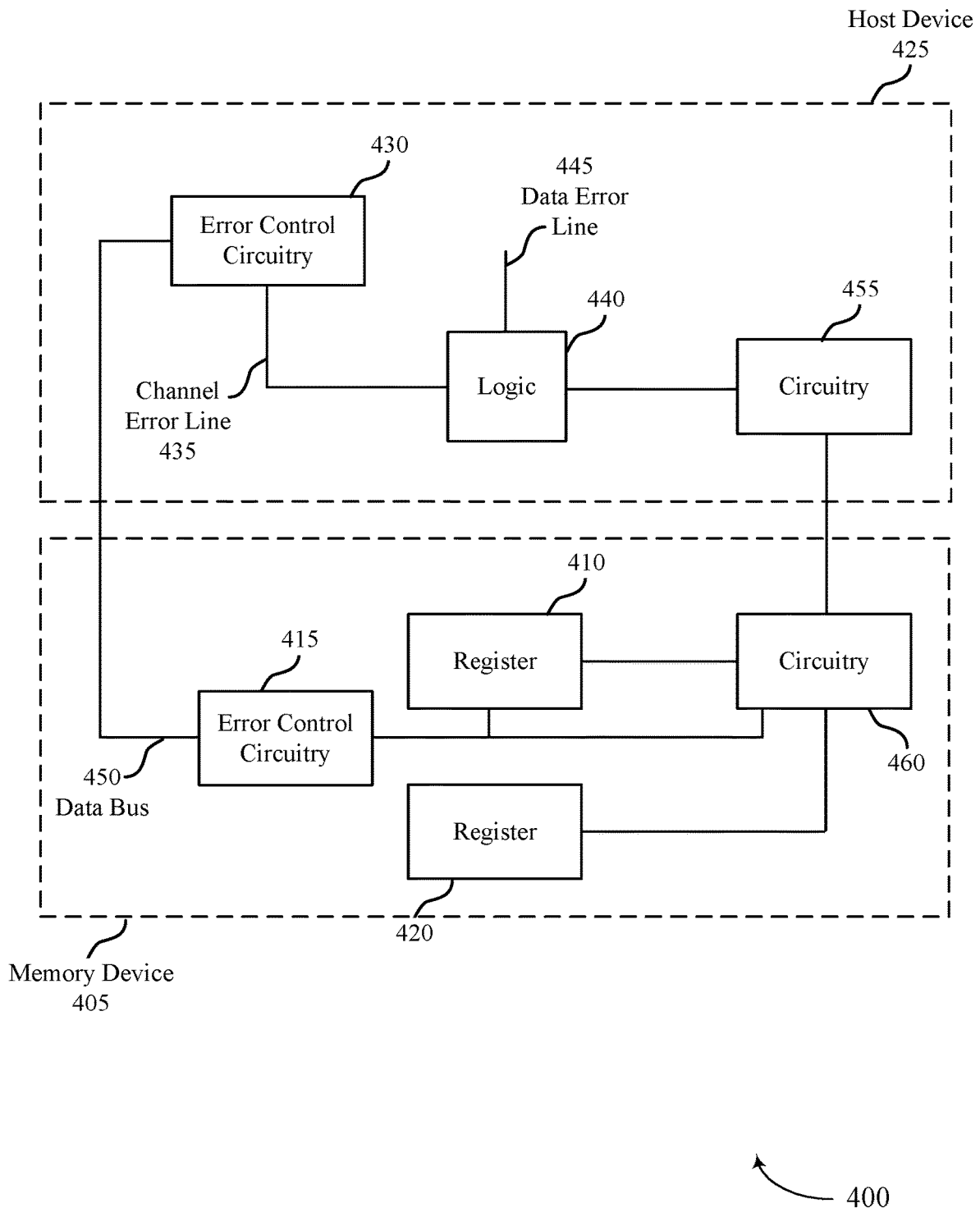
FIG. 4 illustrates an example of a memory system that supports managing error control information using a register in accordance with examples as disclosed herein.

FIG. 4 illustrates an example of a memory system 400 that supports managing error control information using a register in accordance with examples as disclosed herein. Memory system 400 may include a memory device 405 and a host device 425. Memory device 405 may be configured to store data—e.g., memory device 405 may be configured to store application or other data for host device 425. Memory device 405 may include a data bus 450, circuitry 460, error control circuitry 415, a register 410, and a register 420. Error control circuitry 415 may be configured similarly, or the same, as error control circuitry 300 as described with reference to FIG. 3, for example, to detect and/or correct errors in data requested from host device 425 before delivering the requested data to host device 425. Error control circuitry 415 may be configured to store, at register 410, an indication of whether an error was detected in the requested data and/or an address associated with the requested data.

Registers of memory device 405 (e.g., register 410 and register 420) may each include multiple bits, each bit corresponding to a location where data or information may be stored within the corresponding register. For example, memory device 405 may store bit values in various locations of register 410 and register 420, where each location may be associated with a corresponding type of information (e.g., configuration information, error control information, error reporting information). Memory device 405 may store values (e.g., binary values) in registers 410 and 420, which may indicate or represent information associated with the corresponding location in the register. For example, memory device 405 may store a value in a first bit (e.g., first location) of register 420 indicating whether a communication protocol is enabled or disabled and may store a value in a second bit (e.g., second location) of register 420 indicating whether an error control configuration is enabled or disabled. Similarly, memory device 405 may store a value in a first bit (e.g., first location) of register 410 indicating error control information (e.g., indicating whether memory device 405 detected and/or corrected an error in a set of data, based on a result of a syndrome check operation).

Memory device 405 may configure register 410 to operate in a mode (e.g., configuration) selected from a set of modes. For example, memory device 405 may configure register 410 to operate in a first mode (e.g., a syndrome check mode register read (MRR) mode, which may be referred to as S-Check$^{MRR}$) or a second mode (e.g., a master error log mode). Memory device 405 may configure register 410 to operate in one of these modes (e.g., among other modes) based on a communication protocol (e.g., a communication protocol for indicating error control information between memory device 405 and host device 425) and an error control configuration (e.g., a syndrome check configuration).

The communication protocol may specify whether memory device 405 is configured to transmit error control information (e.g., syndrome check information associated with an error control operation) to host device 425 (e.g., with an error control operation). If the communication protocol is enabled, error control circuitry 415 may transmit error control information, such as syndrome check information or results, to host device 425. For example, error control circuitry 415 may transmit the error control information to host device 425 via data bus 450 or via any other communication method or channel (e.g., via circuitry 460 and circuitry 455).

In other examples, the communication protocol may be disabled and error control circuitry 415 may not transmit the error control information (e.g., syndrome check information) to host device 425 (e.g., may not directly or immediately transmit the error control information). For example, error control circuitry 415 may store a value indicative of the error control information in register 410. Host device 425 may configure memory device 405 to operate according to the communication protocol, or to not operate according to the protocol, for example, during a startup or configuration procedure for the host device 425 and memory device 405. Memory device 405 may store a value in register 420, indicating whether the communication protocol is enabled or disabled (e.g., in a first bit of register 420), based on the configuration indicated by host device 425.

The error control configuration may specify a method for detecting and/or correcting errors. For example, an error control configuration may be a syndrome check configuration, an error log configuration, a parity check configuration, or some other error control configuration. An example of an error control configuration (e.g., a syndrome check configuration) may be implemented by error control circuitry 300 as described with reference to FIG. 3. Host device 425 may configure memory device 405 to operate according to the error control configuration, or to not operate according to the error control configuration, for example, during a startup or configuration procedure for the host device 425 and memory device 405. Memory device 405 may store a value in register 420, indicating whether the error control configuration is enabled or disabled (e.g., in a second bit of register 420). When the error control configuration is enabled, memory device 405 may perform one or more error control procedures associated with or indicated by the error control configuration (e.g., may perform a syndrome check as described with reference to FIG. 3). When the error control configuration is disabled, memory device 405 may refrain from performing the one or error control procedures (e.g., a syndrome check).

Memory device 405 may configure register 410 to operate in the first mode (e.g., the syndrome check MRR mode), or the second mode (e.g., the master error log mode) based on the values stored in register 420. The first mode may represent a mode for storing error control information (e.g., syndrome check information) in register 410. The second mode may represent a mode for transmitting error control information (e.g., syndrome check information) to host device 425. In some examples, the communication protocol for transmitting error control information to host device 425 may be disabled and the error control configuration (e.g., syndrome check) may be enabled. As such, memory device 405 (e.g., circuitry 460) may configure register 410 to operate in a syndrome check MRR mode (e.g., S-Check$^{MMR}$ mode or first mode) based on the values in register 420 indicating that the communication protocol (e.g., for transmitting error control information to host device 425) is disabled and the error control configuration (e.g., syndrome check) is enabled. In some examples, circuitry 460 may determine whether the communication protocol is disabled and whether the error control configuration (e.g., syndrome check) is enabled based on the values stored in register 420. Circuitry 460 may configure register 410 to operate in the first mode (e.g., the syndrome check MRR mode), or the second mode (e.g., the master error log mode), based on the values stored in register 420. As described herein, circuitry 460 may represent any combination of circuitry within memory device 405, such as communication and control circuitry.

Memory device 405 may additionally operate according to one or more operational modes, for example, based on whether the one or more operational modes are enabled or disabled (e.g., by host device 425 such as during a startup or configuration procedure). In some cases, memory device 405 may operate according to a first operational mode, such as a master error log mode. In the master error log mode, memory device 405 may record one or more errors in an error log. The one or more errors may be associated with operation of one or more components of memory device 405. Memory device 405 may additionally or alternatively operate according to a second operational mode, which may include indicating, by memory device 405, whether one or more data pins of memory device 405 are communicating valid data.

Memory device 405 may further configure register 410 to operate in the first mode or the second mode based on whether the first operational mode and/or second operational mode of memory device 405 is enabled or disabled. For example, memory device 405 may configure register 410 to operate in syndrome check MRR mode based on determining that the first and second operational modes of memory device 405 are both disabled. In some examples, circuitry 460 may determine whether the one or more operational modes are enabled or disabled. For example, circuitry 460 may determine whether the first operational mode and the second operational mode are enabled or disabled.

In some examples, memory device 405 may store, at a bit or location within register 410, an indication of an output of the error control operation performed by error control circuitry 415. For example, error control circuitry 415 may perform one or more syndrome check operations (e.g., as described with reference to FIG. 3) and may store a result of, or an indication of an output of, the one or more syndrome check operations at a bit or location within register 410 (e.g., when operating in syndrome check MRR mode or the first mode). The bit or location within register 410 may store a value corresponding to the result of a syndrome check operation. For example, error control circuitry 415 may convey an output signal to register 410 and register 410 may store an indication of the output signal using the bit or location. The output signal may be a memory syndrome flag (e.g., an indication of whether an error was corrected by memory device 405) as described with reference to FIG. 3. For example, the bit or location may store a value of '0' if no errors were corrected by memory device 405 (e.g., if the syndrome check operation indicated that the syndromes matched) and may store a value of '1' if at least one error was corrected by memory device 405 (e.g., if the syndrome check operation indicated that the syndromes did not match).

As described herein, register 410 may operate according to a mode selected from a set of modes. For example, register 410 may operate according to a first mode (e.g., a syndrome check MRR mode) or a second mode (e.g., a master error log mode). In the master error log mode, memory device 405 may indicate that one or more errors associated with operation of one or more components of memory device 405 are recorded in an error log. For example, while operating in the master error log mode, register 410 may store one or more values corresponding to the error log at one or more bits of register 410, as shown in Tables 1A and 1B. Tables 1A and 1B may correspond to examples of the different modes of register 410, and the respective values of bits or locations of register 410 that may correspond to the different modes.

TABLE 1A

| Mode | Bit[7] | Bit[6] | Bit[5] | Bit[4] |
|---|---|---|---|---|
| Master Error Log | Fuse Load | Unintended Test Mode | mBIST | Temperature Sensor |
| S-Check$^{MRR}$ | Fuse Load | Unintended Test Mode | mBIST | Temperature Sensor |

TABLE 1B

| Mode | Bit[3] | Bit[2] | Bit[1] | Bit[0] |
|---|---|---|---|---|
| Master Error Log | Register Bit[7] | Health Monitoring | CA Parity | Master Error Log |
| S-Check$^{MRR}$ | Register Bit[7] | Health Monitoring | CA Parity | Syndrome Check |

As shown in Tables 1A and 1B, register 410 may operate according to a first or a second mode, such as a syndrome check MRR mode (e.g., S-Check$^{MRR}$) or a master error log mode. Each bit of the register 410 (e.g., bits 0 through 7) may store information related to error control and may be based on the corresponding mode of the register 410. For example, a first bit (e.g., Bit[0]) may store a value corresponding to an error control operation. While operating in S-Check$^{MRR}$ mode, Bit[0] may store a syndrome flag, which may indicate a result of a syndrome check operation and may be accessible to external devices. In some examples, the output of error control circuitry 415 may be stored in Bit[0] of register 410 and accessed when requested (e.g., polled) by an external device (e.g., host device 425). While operating in the master error log mode, Bit[0] may store information associated with the log of one or more errors.

Bit[1] through Bit[7] of register 410 may store additional values corresponding to error information, for example, when operating in a master error log mode. For example, Bit[1] through Bit[7] may each store a respective binary value corresponding to detection of a defined error detected during operation of memory device 405. A binary value of '1' may represent that an error condition has occurred for the associated error, while a binary value of '0' may represent that an error condition has not occurred. For example, memory device 405 may use Bit[1] through Bit[7] to indicate whether an error has been detected in CA Parity, in health monitoring information, via a temperature sensor, in a fuse load, in a location or bit (e.g., Bit[7]) of another register, or if an unintended test mode has been detected, among other examples.

Data bus 450 may be configured to convey data stored in memory device 405 to error control circuitry 430 (e.g., of the host device 425). In some cases, data bus 450 may deliver data after a request (e.g., a read command) is received from host device 425 for the data. In some examples, data bus 450 may deliver the requested data after the requested data is processed by error control circuitry 415—e.g., after the syndrome match checker performs a process to detect and correct errors in the requested data. In some examples, register 410 may store an indication of a syndrome check flag that indicates whether error control circuitry 415 detected or corrected an error in data requested by host device 425—e.g., by indicating a match or mismatch in the syndromes—and/or an address associated with the requested data. Host device 425 may request the indication of the syndrome check flag from memory device 405. For example, circuitry 455 of host device 425 may transmit a request to circuitry 460 of memory device 405 (e.g., a register read command). In response to the request (e.g., register read command), circuitry 460 may access the indication of the syndrome check flag from register 410 and transmit the indication to circuitry 455. In some cases, the indication may include one or more bits. The bit(s) included in the indication may indicate that each of a first set of syndromes match corresponding syndromes of a second set of syndromes or that a mismatch has been detected between the different sets of syndromes.

In some cases, the memory device 405 (e.g., circuitry 460) may reset the information stored at register 410 based on receiving a register read command from the host device 425. Additionally or alternatively, memory device 405 (e.g., circuitry 460) may reset the information stored at register 410 based on receiving a command (e.g., a reset command) from the host device 425, indicating for the memory device 405 to reset the register 410. Resetting the information stored at the register 410 may include setting the values of the register to respective default values (e.g., to values of '0'). For example, the memory device 405 (e.g., circuitry 460) may set the indication of the syndrome check flag to a default value that indicates that the different syndromes match.

Host device 425 may be configured to access data stored in memory device 405 to support the functioning of an application. Error control circuitry 430 may be configured to detect errors in data received from memory device 405—e.g., in data received over data bus 450—and to indicate whether an error was detected in received data over channel error line 435. Error control circuitry 430 may also be configured to correct errors detected in received data. In some cases, error control circuitry 430 may be configured similarly to error control circuitry 300 described with reference to FIG. 3. among other examples. For example, error control circuitry 430 may support in-line ECC by host device 425. In some cases, error control circuitry 430 may include an initial syndrome circuit that computes an initial ECC for application data before host device 425 writes the application data and the initial ECC to memory device 405 (e.g., as part of a single data burst, which may alternatively be referred to as a data packet, data package, or data codeword).

In some cases, error control circuitry 430 may also include an access syndrome circuit that computes a calculated ECC for the application data after receiving the data from memory device 405 (e.g., by parsing a received data burst corresponding to the previously written data burst to obtain a first subset of the data burst corresponding to the previously written application data (payload) and a second subset of the data burst corresponding to parity information for the first subset that was previously calculated (generated) by host device 425 (initial ECC for the payload)). Additionally or alternatively, error control circuitry 430 may include a match circuit to compare the initial and calculated ECCs to determine there is an error in the received data. as well as an error indication circuit to indicate whether there is an error in the received data. In some cases, an error correction/detection circuit included in error control circuitry 430 may be configured to detect DBEs and to correct single errors in received data—e.g., error control circuitry 430 may use SECDED techniques—and each of the stored syndrome circuit, the access syndrome circuit, and the match circuit may be configured to output an additional syndrome bit.

Channel error line 435 may be configured to convey an output signal generated by error control circuitry 430 to logic component 440. In some examples, channel error line 435 may convey a "channel syndrome flag" that indicates whether error control circuitry 430 detected an error in the received version of data requested from memory device 405. In some cases, channel error line 435 is a conductive trace. In other cases, channel error line 435 is a wireless link. Similarly, logic component 440 may be coupled with circuitry 455, which may support communication of a "memory syndrome flag" (e.g., as received by circuitry 455 from the memory device 405, based on the register read) from the circuitry 455 to logic component 440.

Logic component 440 may be configured to determine whether one or both of error control circuitry 430 or error control circuitry 415 detect an error in a processed set of data. In some cases, logic component 440 outputs a multi-bit error (MBE) flag if a memory syndrome flag (e.g., output by error control circuitry 415 or retrieved from register 410) and channel syndrome flag (e.g., output by error control circuitry 430) indicate that an error was detected. For example, logic component 440 may output an MBE flag that indicates an MBE has occurred when a memory syndrome flag indicates a mismatch and a channel syndrome flag indicates a mismatch.

Data error line 445 may be configured to convey an output signal generated by logic component 440. In some examples, logic component 440 may output an MBE flag that indicates that the requested data stored in memory device 405 includes multiple corrupted bits. One or more other components of the host device 425 may, for example, use the output on data error line 445 to determine whether to use, correct, or discard data received from the memory device. For example, if a correctable MBE has occurred, the host device 425 may correct the MBE. In other examples, if an uncorrectable MBE (e.g., a TBE or higher) has occurred, the host device 425 may determine to discard the data. In some other examples, if no errors have occurred, or if the host device 425 determines that the errors were detected or corrected, the host device 425 may use the data.

Host device 425 may use the outputs of error control circuitry 415, register 410, error control circuitry 430, and logic component 440 to detect errors (including MBEs) in received data, as shown in Table 2. Table 2 may correspond to an example where memory device 405 uses SEC techniques and host device 425 uses SECDED techniques, although other error control techniques are possible for both memory device 405 and host device 425 without departing from the scope of the present disclosure (e.g., host device 425 may use double error correction (DEC), triple error detection (TED), triple error correction (TEC)).

TABLE 2

| State of Requested Data before ECC at the Memory Device | Memory SEC SyndromeFlag | Host SECDED Syndrome Flag | Multi-Bit Error Flag | Host Error Detection |
|---|---|---|---|---|
| No Error | 0 | 0 | 0 | Detects No Error in Received Data |
| SBE | 1 | 0 | 0 | Detects SBE Correction |
| DBE w/out Aliasing | 1 | 1 | 1 | Detects DBE in Received Data |
| DBE w/Aliasing | 1 | 1 | 1 | Detects MBE in Received Data-e.g., won't treat detected error as SBE |
| MBE | 1 | 1 | 1 | Detects MBE in Received Data-e.g., won't treat odds as SBE |

In some examples, as shown in Table 2, requested data (e.g., before ECC at memory device 405) may include an SBE, a DBE without aliasing, a DBE with aliasing, an MBE, or no error. If the requested data includes no error, host device 425 may detect that there is no error in received data. If the requested data includes an SBE, host device 425 may detect that the SBE was corrected by memory device 405 (e.g., based on the "memory syndrome flag" received from the register 410 of the memory device). If the requested data includes a DBE without aliasing, host device 425 may detect the DBE in the received data (e.g., based on the "memory syndrome flag"). If the requested data includes a DBE with aliasing, host device 425 may detect an MBE in received data (e.g., based on the "memory syndrome flag") and may not treat the detected error as an SBE. If the request data includes an MBE, host device 425 may detect an MBE in received data and may not treat the MBE as an SBE. For example, host device 425 may detect higher order errors (e.g., DBEs and MBEs) that may have otherwise been undetectable, because the memory device 405 may indicate whether an error was detected or corrected at the memory device 405 (e.g., using error control circuitry 415). In some examples, when a DBE or MBE is detected, host device 425 may determine not to use data associated with the errors.

Host device 425 may also use the outputs of register 410, error control circuitry 430, and logic component 440 to manage the processing of data received from memory. In some examples, after receiving an indication from register 410 that no error was detected in requested data, host device 425 may forego performing an error detection procedure of the received data. For example, if error control circuitry 415 uses a SEC scheme and/or link protection (e.g., cyclic redundancy check (CRC) or link ECC) is being run for transmissions of data over the memory channel and error control circuitry 430 uses a SECDED scheme, host device 425 may refrain from performing ECC in some scenarios, as depicted in Table 3.

TABLE 3

| State of Requested Data before ECC at the Memory Device | Memory SEC Syndrome Flag | Host SECDED Syndrome Flag | Multi-Bit ErrorFlag | Host ECC Calculation Decision (Detection) |
|---|---|---|---|---|
| No Error | 0 | 0 | 0 | Doesn't Calculate ECC (No Error) |
| SBE | 1 | 0 | 0 | Doesn't Calculate ECC (No Error) |
| DBE w/out Aliasing | 1 | 1 | 1 | Calculates ECC (DBE Detected) |
| DBE w/Aliasing | 1 | 1 | 1 | Calculates ECC (MBE Detected) |
| MBE | 1 | 1 | 1 | Calculates ECC (MBE Detected) | n some cases (e.g., if host device 425 uses a syndrome match checker), host device 425 further refrains from performing an ECC calculation if the memory syndrome flag indicates that an error of a defined type (e.g., an SBE) was corrected.

In some examples, as shown in Table 3, requested data (e.g., before ECC at memory device 405) may include an SBE, a DBE without aliasing, a DBE with aliasing, a MBE, or no error. If the requested data includes no error or an SBE (e.g., as indicated by the "memory syndrome flag"), host device 425 may not calculate an ECC. If the requested data includes a DBE without aliasing (e.g., as indicated by the "memory syndrome flag" and the "host syndrome flag" together), host device 425 may calculate an ECC and detect the DBE in the received data. If the requested data includes a DBE with aliasing (e.g., as indicated by the "memory syndrome flag" and the "host syndrome flag" together), host device 425 may calculate an ECC and detect an MBE in received data. If the requested data includes an MBE, host device 425 may detect an MBE in received data (e.g., as indicated by the "memory syndrome flag" and the "host syndrome flag" together). Based on the indication of the "memory syndrome flag," host device 425 may detect higher order errors (e.g., DBEs and MBEs) that may have otherwise been undetectable and forego performing other error detection procedures (e.g., unnecessary procedures). In some examples, when a DBE or MBE is detected, host device 425 may determine not to use data associated with the errors.

In another example, if error control circuitry 415 uses a SECDED scheme and/or link protection (e.g., CRC or link ECC) is being run for transmissions of data over the memory channel and error control circuitry 430 uses a SECDED scheme, host device 425 may refrain from performing ECC in some scenarios, as depicted in Table 4.

TABLE 4

| State of Requested Data before ECC at the Memory Device | Memory SECDED SyndromeFlag | Host SECDED Syndrome Flag | Multi-Bit Error Flag | Host ECC Calculation Decision (Detection) |
| --- | --- | --- | --- | --- |
| No Error | 0 | 0 | 0 | Doesn't Calculate ECC (No Error) |
| SBE | 1 | 0 | 0 | Calculates ECC (Corrected SBE Detected) |
| DBE | 1 | 1 | 1 | Calculates ECC (DBE Detected) |
| MBE | 1 | 1 | 1 | Calculates ECC (MBE Detected) |

In some cases, host device 425 further refrains from performing an ECC calculation if the memory syndrome flag indicates that an error of a defined type (e.g., an SBE) was corrected.

In some examples, as shown in Table 4, requested data (e.g., before ECC at memory device 405) may include an SBE, a DBE, an MBE, or no error. If the requested data includes no error or an SBE (e.g., as indicated by the "memory syndrome flag"), host device 425 may not calculate an ECC. If the requested data includes a DBE (e.g., as indicated by the "memory syndrome flag" and the "host syndrome flag" together), host device 425 may calculate an ECC and detect the DBE in the received data. If the requested data includes an MBE (e.g., as indicated by the "memory syndrome flag" and the "host syndrome flag" together), host device 425 may detect an MBE in received data. Based on the indication of the syndrome flag from memory device 405, host device 425 may detect higher order errors (e.g., DBEs and MBEs) that may have otherwise been undetectable and forego performing other error detection procedures (e.g., unnecessary procedures). In some examples, when a DBE or MBE is detected, host device 425 may determine not to use data associated with the errors.

Host device 425 may also use the outputs of register 410, error control circuitry 430, and logic component 440 to manage the storage of data in memory. In some examples, after identifying that data stored in memory device 405 includes multiple-bit errors, host device 425 may blacklist the memory address associated with the data. That is, host device 425 may indicate to memory device 405 that no application data for host device 425 is to be stored at the blacklisted memory address in a memory array of memory device 405.

Additionally or alternatively, host device 425 or memory device 405 may use the information to perform "smart scrubbing" of the memory array in memory device 405—an error correction technique that involves periodically reading the contents of a memory array, performing an error correction on the contents of the memory array, and rewriting data that is identified as being corrupted with the correct version of the data may be referred to as "scrubbing." That is, host device 425 may trigger memory device 405 to—or memory device 405 on its own—may scrub (e.g., only) data located at the memory addresses that have been identified by and/or indicated by memory device 405 as being corrupted. The scrubbing procedure may skip (e.g., ignore) pages or other sets of memory cells not associated with an identified error during a relevant time period (e.g., over the entire operation history of the device, or after a last scrubbing procedure).

In some examples, host device 425 may not include error control circuitry 430— e.g., host device 425 may not generate a host syndrome flag. In such cases, host device 425 may use the output of register 410 to detect, or aid in the detection of, errors in received data.

For example, if error control circuitry 415 uses a SEC scheme and/or link protection (e.g., CRC or link ECC) is being run for transmissions of data over the memory channel and host device 425 does not include error control circuitry 430, host device 425 may refrain from performing ECC in some scenarios, as depicted in Table 5.

TABLE 5

| State of Requested Data before ECC at the Memory Device | Memory SEC Syndrome Flag | Host SECDED Syndrome Flag | Multi-Bit Error Flag | Host ECC Calculation Decision (Detection) |
|---|---|---|---|---|
| No Error | 0 | N/A | N/A | Doesn't Calculate ECC (No Error) |
| SBE | 1 | N/A | N/A | Calculates ECC (No Error Detected) |
| DBE w/out Aliasing | 1 | N/A | N/A | Calculates ECC (DBE Detected) |
| DBE w/Aliasing | 1 | N/A | N/A | Calculates ECC (Detects SBE) |
| MBE | 1 | N/A | N/A | Calculates ECC (Treats Odds as SBE) |

In some examples, as shown in Table 5, requested data (e.g., before ECC at memory device 405) may include an SBE, a DBE without aliasing, a DBE with aliasing, a MBE, or no error. If the requested data includes no error, host device 425 may not calculate an ECC. If the requested data includes an SBE, host device 425 may calculate an ECC and may not detect an error. If the requested data includes a DBE without aliasing, host device 425 may calculate an ECC and detect the DBE in the received data. If the requested data includes a DBE with aliasing, host device 425 may calculate an ECC and detect an SBE in received data. If the request data includes an MBE, host device 425 may calculate an ECC and may treat odds as an SBE. Host device 425 may detect higher order errors (e.g., DBEs and MBEs) that may have otherwise been undetectable. In some examples, when an error is detected, host device 425 may determine not to use data associated with the errors.

In another example, if error control circuitry 415 uses a SECDED scheme and/or link protection (e.g., CRC or link ECC) is being run for transmissions of data over the memory channel and host device 425 does not include error control circuitry 430, host device 425 may refrain from performing ECC in some scenarios, as depicted in Table 6.

TABLE 6

| State of Requested Data before ECC at the Memory Device | Memory SECDED Syndrome Flag | Host SECDED Syndrome Flag | Multi-Bit Error Flag | Host ECC Calculation Decision (Detection) |
|---|---|---|---|---|
| No Error | 0 | N/A | N/A | Doesn't Calculate ECC (No Error) |
| SBE | 1 | N/A | N/A | Calculates ECC (No Error Detected) |
| DBE | 1 | N/A | N/A | Calculates ECC (DBE Detected) |
| MBE | 1 | N/A | N/A | Calculates ECC (Treats Odds as SBE) |

In some examples, as shown in Table 6, requested data (e.g., before ECC at memory device 405) may include an SBE, a DBE, an MBE, or no error. If the requested data includes no error, host device 425 may not calculate an ECC. If the requested data includes an SBE, host device 425 may calculate an ECC and may not detect an error. If the requested data includes a DBE, host device 425 may calculate an ECC and detect the DBE in the received data. If the request data includes an MBE, host device 425 may calculate an ECC and may treat odds as an SBE. Host device 425 may detect higher order errors (e.g., DBEs and MBEs) that may have otherwise been undetectable. In some examples, when an error is detected, host device 425 may determine not to use data associated with the errors.

Figure 5:
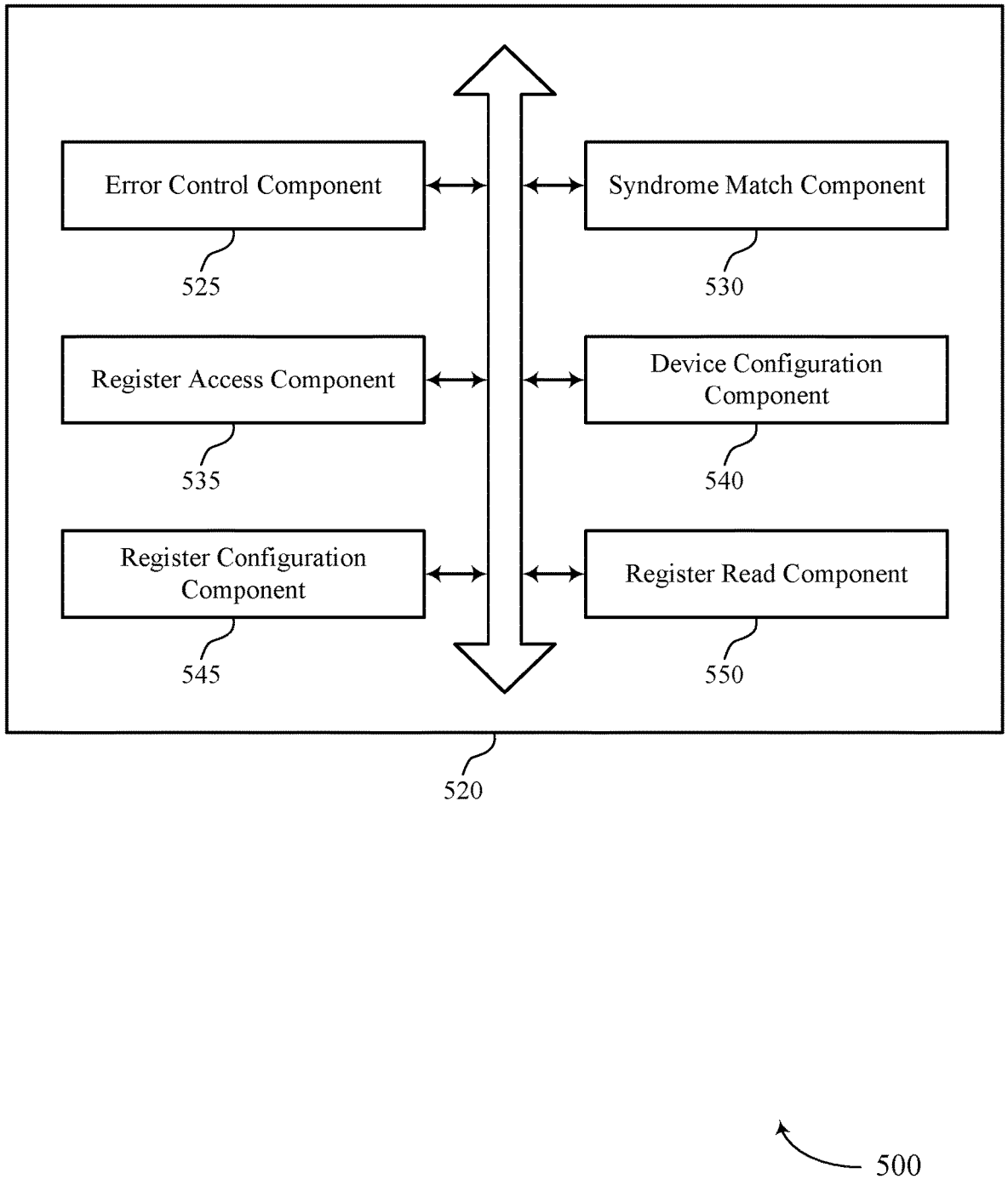
FIG. 5 shows a block diagram of a memory device that supports managing error control information using a register in accordance with examples as disclosed herein.

FIG. 5 shows a block diagram 500 of a memory device 520 that supports managing error control information using a register in accordance with examples as disclosed herein. The memory device 520 may be an example of aspects of a memory device as described with reference to FIGS. 1 through 4. The memory device 520, or various components thereof, may be an example of means for performing various aspects of managing error control information using a register as described herein. For example, the memory device 520 may include an error control component 525, a syndrome match component 530, a register access component 535, a device configuration component 540, a register configuration component 545, a register read component 550, or any combination thereof. Each of these components may communicate, directly or indirectly, with one another (e.g., via one or more buses).

The error control component 525 may be configured as or otherwise support a means for generating, at a memory device, a first set of multiple syndromes based on receiving data for storage at the memory device, the first set of multiple syndromes associated with an error control operation for the received data, each syndrome of the first set including error correction or error detection syndrome bits.

In some examples, the error control component 525 may be configured as or otherwise support a means for generating, at the memory device, a second set of multiple syndromes based on retrieving the data, the second set of multiple syndromes associated with the retrieved data and the error control operation, each syndrome of the second set including error correction or error detection syndrome bits. The syndrome match component 530 may be configured as or otherwise support a means for determining whether the first set of multiple syndromes matches the second set of multiple syndromes based on comparing the first set of multiple syndromes and the second set of multiple syndromes. The register access component 535 may be configured as or otherwise support a means for storing, at a register of the memory device, an indication of whether the first set of multiple syndromes matches the second set of multiple syndromes.

In some examples, the device configuration component 540 may be configured as or otherwise support a means for determining that a first communication protocol for reporting information to a host device is disabled. In some examples, the device configuration component 540 may be configured as or otherwise support a means for determining that a first error control configuration is enabled for reporting a comparison of syndromes generated by the memory device according to the error control operation, where storing the indication at the register is based on determining that the first communication protocol is disabled and the first error control configuration is enabled.

In some examples, the register access component 535 may be configured as or otherwise support a means for accessing a second register of the memory device that stores a status of the first communication protocol and a status of the first error control configuration, where determining that the first communication protocol is disabled and the first error control configuration is enabled is based on accessing the second register.

In some examples, the device configuration component 540 may be configured as or otherwise support a means for determining that an operational mode of the memory device is disabled, the operational mode including recording in an error log one or more errors associated with operation of one or more components of the memory device, where storing the indication at the register is based on determining that the operational mode is disabled.

In some examples, the device configuration component 540 may be configured as or otherwise support a means for determining that a second operational mode of the memory device is disabled, the second operational mode for indicating whether one or more data pins of the memory device are communicating valid data, where storing the indication at the register is based on determining that the second operational mode is disabled.

In some examples, the register read component 550 may be configured as or otherwise support a means for receiving, from a host device, a command for reading information stored at the register. In some examples, the register read component 550 may be configured as or otherwise support a means for outputting, to the host device, the indication based on receiving the command.

In some examples, the register access component 535 may be configured as or otherwise support a means for resetting the information stored at the register based on receiving the command from the host device, where resetting the information includes setting the indication to a default value that indicates that different syndromes match.

In some examples, the register access component 535 may be configured as or otherwise support a means for receiving, from a host device, a command for resetting information stored at the register. In some examples, the register access component 535 may be configured as or otherwise support a means for resetting the information stored at the register based on receiving the command from the host device, where resetting the information includes setting the indication to a default value that indicates that different syndromes match.

In some examples, the register is configured to operate in a mode selected from a set of modes, the set of modes including a first mode for reporting the indication of whether the first set of multiple syndromes matches the second set of multiple syndromes and a second mode for recording in an error log one or more errors associated with operation of one or more components of the memory device.

In some examples, the indication includes one or more bits and a value of the one or more bits indicates that each of the first set of multiple syndromes match corresponding syndromes of the second set of multiple syndromes.

In some examples, the indication includes one or more bits and a value of the one or more bits indicates that at least one of the first set of multiple syndromes does not match a corresponding syndrome of the second set of multiple syndromes.

The device configuration component 540 may be configured as or otherwise support a means for determining, at a memory device, that a first communication protocol for reporting information to a host device is enabled or disabled. In some examples, the device configuration component 540 may be configured as or otherwise support a means for determining, at the memory device, that a first error control configuration for reporting a comparison of syndromes generated by the memory device is enabled or disabled. The register configuration component 545 may be configured as or otherwise support a means for configuring a register of the memory device to operate in a first mode based on determining that the first communication protocol is disabled and the first error control configuration is enabled.

In some examples, the register access component 535 may be configured as or otherwise support a means for accessing a second register of the memory device that stores a status of the first communication protocol and a status of the first error control configuration, where determining that the first communication protocol is enabled and the first error control configuration is enabled is based on accessing the second register.

In some examples, the device configuration component 540 may be configured as or otherwise support a means for determining that an operational mode of the memory device is disabled, the operational mode including recording in an error log one or more errors associated with operation of one or more components of the memory device, where configuring the register to operate in the first mode is based on determining that the operational mode is disabled.

In some examples, the device configuration component 540 may be configured as or otherwise support a means for determining that a second operational mode of the memory device is disabled, the second operational mode for indicating whether one or more data pins of the memory device are communicating valid data, where configuring the register to operate in the first mode is based on determining that the second operational mode is disabled.

In some examples, the first mode indicates a location within the register for storing one or more bits indicative of a result of an error control operation performed by the memory device.

In some examples, the register is configured to operate in a mode selected from a set of modes, the set of modes including the first mode and a second mode for recording in an error log one or more errors associated with operation of one or more components of the memory device.

In some examples, the error control component 525 may be configured as or otherwise support a means for performing an error control operation to detect or correct one or more errors in data stored at the memory device. In some examples, the syndrome match component 530 may be configured as or otherwise support a means for determining whether a first set of multiple syndromes associated with the error control operation matches a second set of multiple syndromes associated with the error control operation. In some examples, the register access component 535 may be configured as or otherwise support a means for storing, at the register and based on configuring the register to operate in the first mode, an indication of whether the first set of multiple syndromes matches the second set of multiple syndromes.

Figure 6:
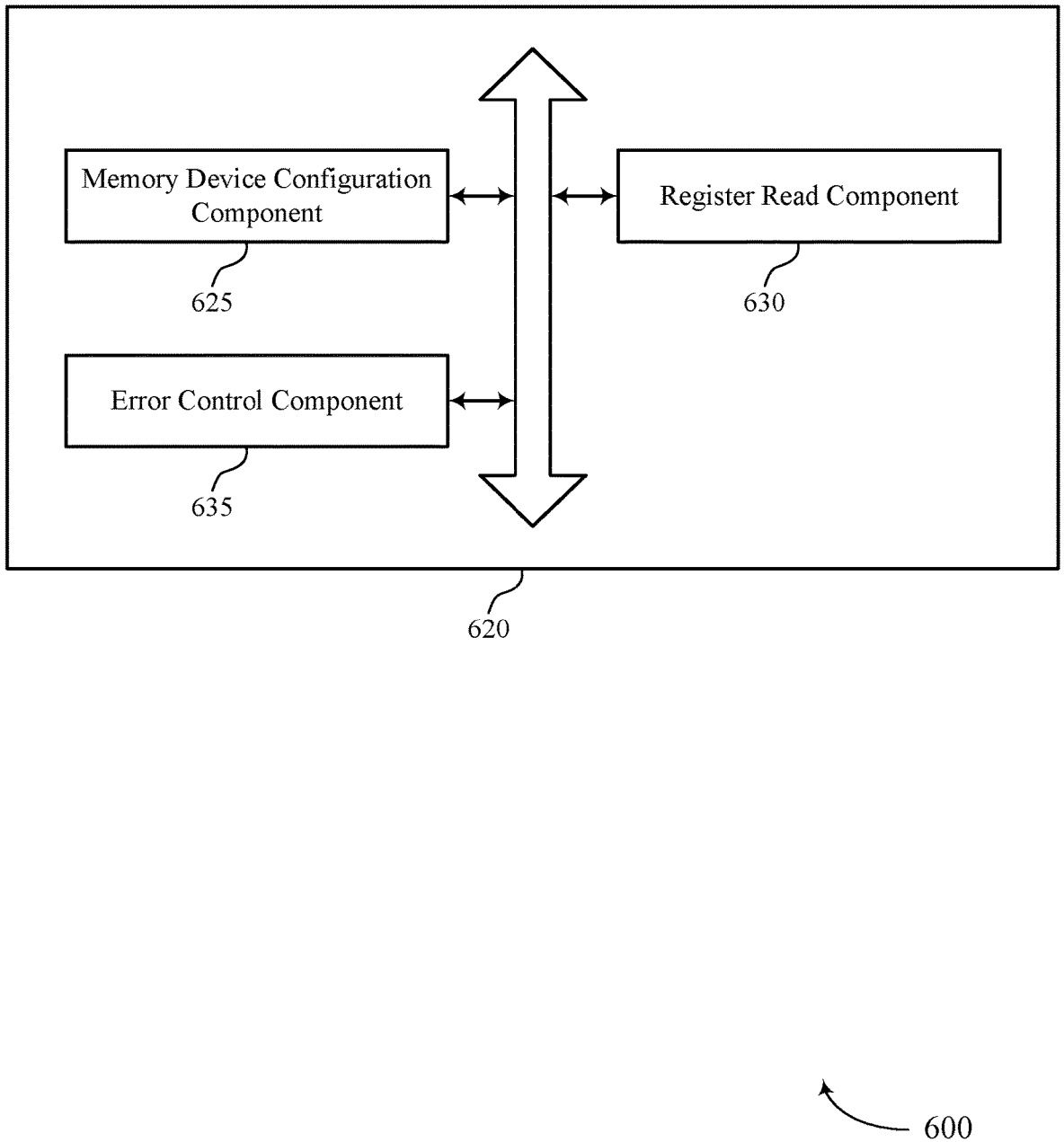
FIG. 6 shows a block diagram of a host device that supports managing error control information using a register in accordance with examples as disclosed herein.

FIG. 6 shows a block diagram 600 of a host device 620 that supports managing error control information using a register in accordance with examples as disclosed herein. The host device 620 may be an example of aspects of a host device as described with reference to FIGS. 1 through 4. The host device 620, or various components thereof, may be an example of means for performing various aspects of managing error control information using a register as described herein. For example, the host device 620 may include a memory device configuration component 625, a register read component 630, an error control component 635, or any combination thereof. Each of these components may communicate, directly or indirectly, with one another (e.g., via one or more buses).

The memory device configuration component 625 may be configured as or otherwise support a means for writing, by a host device to a first register associated with a memory device, a first indication that a first communication protocol for reporting information from the memory device to the host device is disabled. In some examples, the memory device configuration component 625 may be configured as or otherwise support a means for writing, by the host device to the first register, a second indication that a first error control configuration for reporting a comparison of syndromes generated by the memory device is enabled. The register read component 630 may be configured as or otherwise support a means for transmitting, to the memory device, a command to read information stored at a second register of the memory device based on the first communication protocol being disabled and the first error control configuration being enabled, the information indicating whether a first set of multiple syndromes matches a second set of multiple syndromes associated with an error control operation performed at the memory device.

In some examples, the memory device configuration component 625 may be configured as or otherwise support a means for writing, by the host device to the first register of the memory device, a third indication that an operational mode of the memory device is disabled, the operational mode including recording in an error log one or more errors associated with operation of one or more components of the memory device, where transmitting the command is based on determining that the operational mode is disabled.

In some examples, the error control component 635 may be configured as or otherwise support a means for determining to request, from the memory device, information indicative of a result of the error control operation, where transmitting the command is based on determining to request the information.

Figure 7:
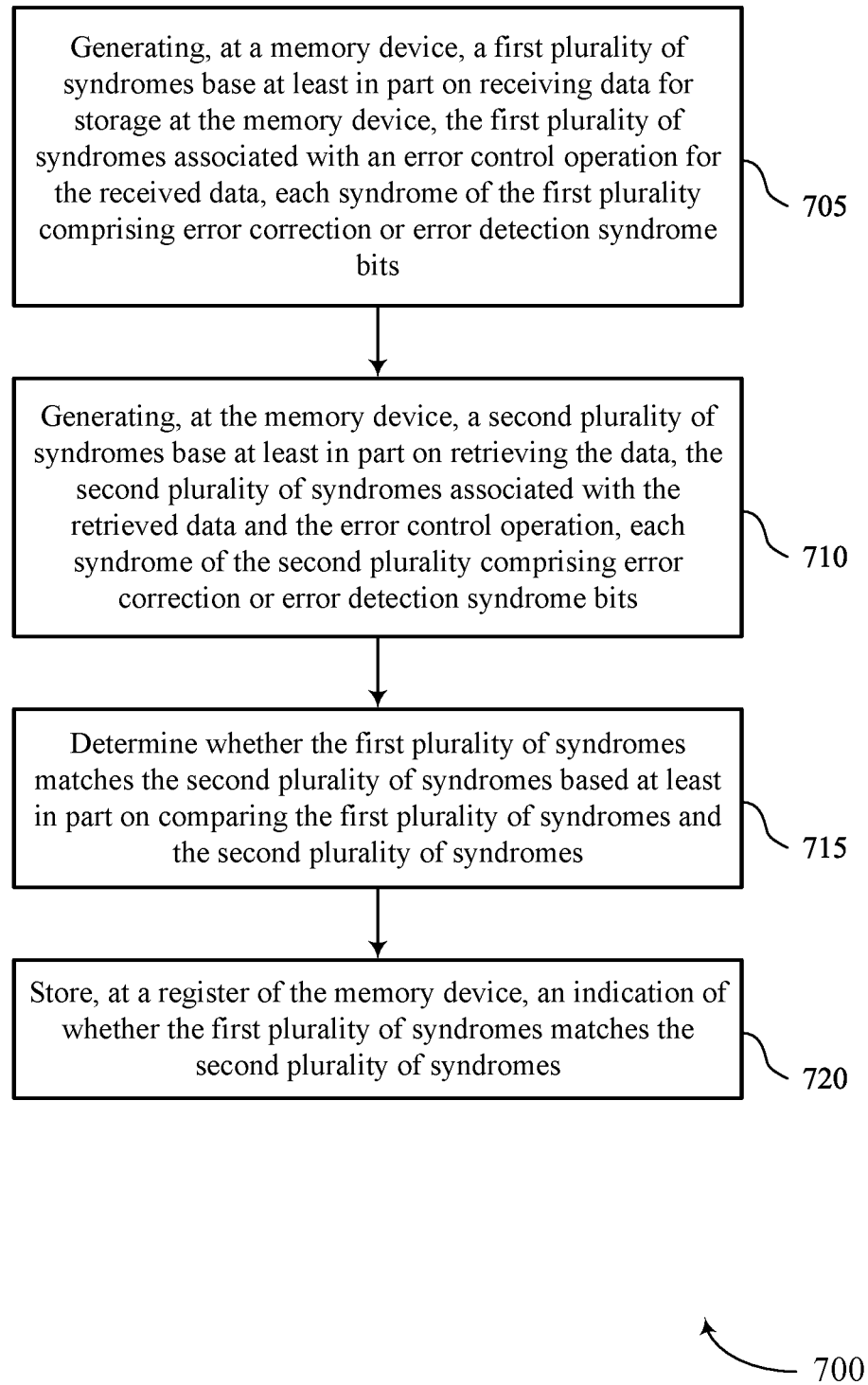
FIGS. 7 through 9 show flowcharts illustrating a method or methods that support managing error control information using a register in accordance with examples as disclosed herein.

FIG. 7 shows a flowchart illustrating a method 700 that supports managing error control information using a register in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 705, the method may include generating, at a memory device, a first set of multiple syndromes based on receiving data for storage at the memory device, the first set of multiple syndromes associated with an error control operation for the received data, each syndrome of the first set including error correction or error detection syndrome bits. The operations of 705 may be performed in accordance with examples as disclosed herein. In some examples, aspects of the operations of 705 may be performed by an error control component 525 as described with reference to FIG. 5.

At 710, the method may include generating, at the memory device, a second set of multiple syndromes based on retrieving the data, the second set of multiple syndromes associated with the retrieved data and the error control operation, each syndrome of the second set including error correction or error detection syndrome bits. The operations of 710 may be performed in accordance with examples as disclosed herein. In some examples, aspects of the operations of 710 may be performed by an error control component 525 as described with reference to FIG. 5.

At 715, the method may include determining whether the first set of multiple syndromes matches the second set of multiple syndromes based on comparing the first set of multiple syndromes and the second set of multiple syndromes. The operations of 715 may be performed in accordance with examples as disclosed herein. In some examples, aspects of the operations of 715 may be performed by a syndrome match component 530 as described with reference to FIG. 5.

At 720, the method may include storing, at a register of the memory device, an indication of whether the first set of multiple syndromes matches the second set of multiple syndromes. The operations of 720 may be performed in accordance with examples as disclosed herein. In some examples, aspects of the operations of 720 may be performed by a register access component 535 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for generating, at a memory device, a first set of multiple syndromes based on receiving data for storage at the memory device, the first set of multiple syndromes associated with an error control operation for the received data, each syndrome of the first set including error correction or error detection syndrome bits, generating, at the memory device, a second set of multiple syndromes based on retrieving the data, the second set of multiple syndromes associated with the retrieved data and the error control operation, each syndrome of the second set including error correction or error detection syndrome bits, determining whether the first set of multiple syndromes matches the second set of multiple syndromes based on comparing the first set of multiple syndromes and the second set of multiple syndromes, and storing, at a register of the memory device, an indication of whether the first set of multiple syndromes matches the second set of multiple syndromes.

Some examples of the method 700 and the apparatus described herein may further include operations, features, circuitry, logic, means, or instructions for determining that a first communication protocol for reporting information to a host device may be disabled and determining that a first error control configuration may be enabled for reporting a comparison of syndromes generated by the memory device according to the error control operation, where storing the indication at the register may be based on determining that the first communication protocol may be disabled and the first error control configuration may be enabled.

Some examples of the method 700 and the apparatus described herein may further include operations, features, circuitry, logic, means, or instructions for accessing a second register of the memory device that stores a status of the first communication protocol and a status of the first error control configuration, where determining that the first communication protocol may be disabled and the first error control configuration may be enabled may be based on accessing the second register.

Some examples of the method 700 and the apparatus described herein may further include operations, features, circuitry, logic, means, or instructions for determining that an operational mode of the memory device may be disabled, the operational mode including recording in an error log one or more errors associated with operation of one or more components of the memory device, where storing the indication at the register may be based on determining that the operational mode may be disabled.

Some examples of the method 700 and the apparatus described herein may further include operations, features, circuitry, logic, means, or instructions for determining that a second operational mode of the memory device may be disabled, the second operational mode for indicating whether one or more data pins of the memory device may be communicating valid data, where storing the indication at the register may be based on determining that the second operational mode may be disabled.

Some examples of the method 700 and the apparatus described herein may further include operations, features, circuitry, logic, means, or instructions for receiving, from a host device, a command for reading information stored at the register and outputting, to the host device, the indication based on receiving the command.

Some examples of the method 700 and the apparatus described herein may further include operations, features, circuitry, logic, means, or instructions for resetting the information stored at the register based on receiving the command from the host device, where resetting the information includes setting the indication to a default value that indicates that different syndromes match.

Some examples of the method 700 and the apparatus described herein may further include operations, features, circuitry, logic, means, or instructions for receiving, from a host device, a command for resetting information stored at the register and resetting the information stored at the register based on receiving the command from the host device, where resetting the information includes setting the indication to a default value that indicates that different syndromes match.

In some examples of the method 700 and the apparatus described herein, the register may be configured to operate in a mode selected from a set of modes, the set of modes including a first mode for reporting the indication of whether the first set of multiple syndromes matches the second set of multiple syndromes and a second mode for recording in an error log one or more errors associated with operation of one or more components of the memory device.

In some examples of the method 700 and the apparatus described herein, the indication includes one or more bits and a value of the one or more bits indicates that each of the first set of multiple syndromes match corresponding syndromes of the second set of multiple syndromes.

In some examples of the method 700 and the apparatus described herein, the indication includes one or more bits and a value of the one or more bits indicates that at least one of the first set of multiple syndromes does not match a corresponding syndrome of the second set of multiple syndromes.

Figure 8:
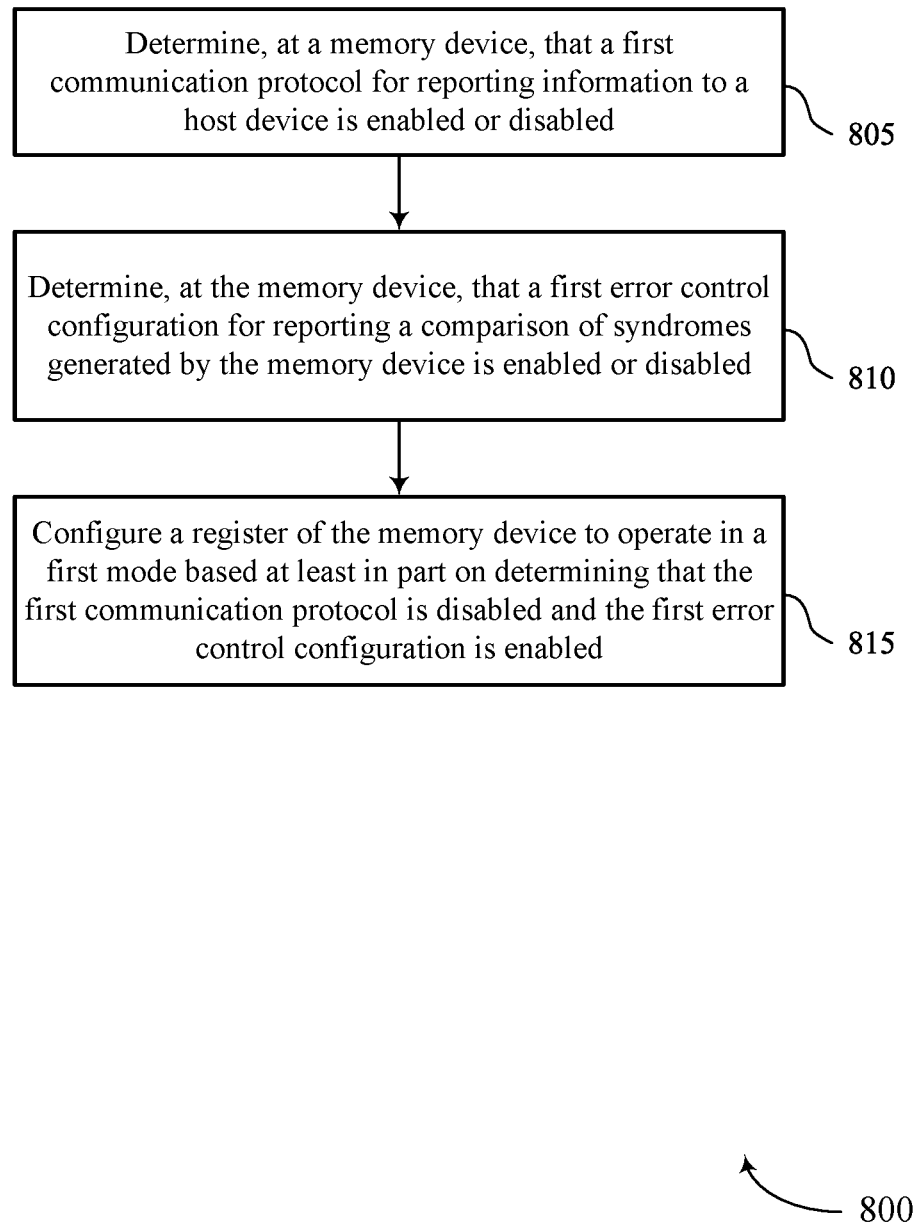

FIG. 8 shows a flowchart illustrating a method 800 that supports managing error control information using a register in accordance with examples as disclosed herein. The operations of method 800 may be implemented by a memory device or its components as described herein. For example, the operations of method 800 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 805, the method may include determining, at a memory device, that a first communication protocol for reporting information to a host device is enabled or disabled. The operations of 805 may be performed in accordance with examples as disclosed herein. In some examples, aspects of the operations of 805 may be performed by a device configuration component 540 as described with reference to FIG. 5.

At 810, the method may include determining, at the memory device, that a first error control configuration for reporting a comparison of syndromes generated by the memory device is enabled or disabled. The operations of 810 may be performed in accordance with examples as disclosed herein. In some examples, aspects of the operations of 810 may be performed by a device configuration component 540 as described with reference to FIG. 5.

At 815, the method may include configuring a register of the memory device to operate in a first mode based on determining that the first communication protocol is disabled and the first error control configuration is enabled. The operations of 815 may be performed in accordance with examples as disclosed herein. In some examples, aspects of the operations of 815 may be performed by a register configuration component 545 as described with reference to FIG. 5.

In some examples, an apparatus as described herein may perform a method or methods, such as the method 800. The apparatus may include, features, circuitry, logic, means, or instructions (e.g., a non-transitory computer-readable medium storing instructions executable by a processor) for determining, at a memory device, that a first communication protocol for reporting information to a host device is enabled or disabled, determining, at the memory device, that a first error control configuration for reporting a comparison of syndromes generated by the memory device is enabled or disabled, and configuring a register of the memory device to operate in a first mode based on determining that the first communication protocol is disabled and the first error control configuration is enabled.

Some examples of the method 800 and the apparatus described herein may further include operations, features, circuitry, logic, means, or instructions for accessing a second register of the memory device that stores a status of the first communication protocol and a status of the first error control configuration, where determining that the first communication protocol may be enabled and the first error control configuration may be enabled may be based on accessing the second register.

Some examples of the method 800 and the apparatus described herein may further include operations, features, circuitry, logic, means, or instructions for determining that an operational mode of the memory device may be disabled, the operational mode including recording in an error log one or more errors associated with operation of one or more components of the memory device, where configuring the register to operate in the first mode may be based on determining that the operational mode may be disabled.

Some examples of the method 800 and the apparatus described herein may further include operations, features, circuitry, logic, means, or instructions for determining that a second operational mode of the memory device may be disabled, the second operational mode for indicating whether one or more data pins of the memory device may be communicating valid data, where configuring the register to operate in the first mode may be based on determining that the second operational mode may be disabled.

In some examples of the method 800 and the apparatus described herein, the first mode indicates a location within the register for storing one or more bits indicative of a result of an error control operation performed by the memory device.

In some examples of the method 800 and the apparatus described herein, the register may be configured to operate in a mode selected from a set of modes, the set of modes including the first mode and a second mode for recording in an error log one or more errors associated with operation of one or more components of the memory device.

Some examples of the method 800 and the apparatus described herein may further include operations, features, circuitry, logic, means, or instructions for performing an error control operation to detect or correct one or more errors in data stored at the memory device, determining whether a first set of multiple syndromes associated with the error control operation matches a second set of multiple syndromes associated with the error control operation, and storing, at the register and based on configuring the register to operate in the first mode, an indication of whether the first set of multiple syndromes matches the second set of multiple syndromes.

Figure 9:
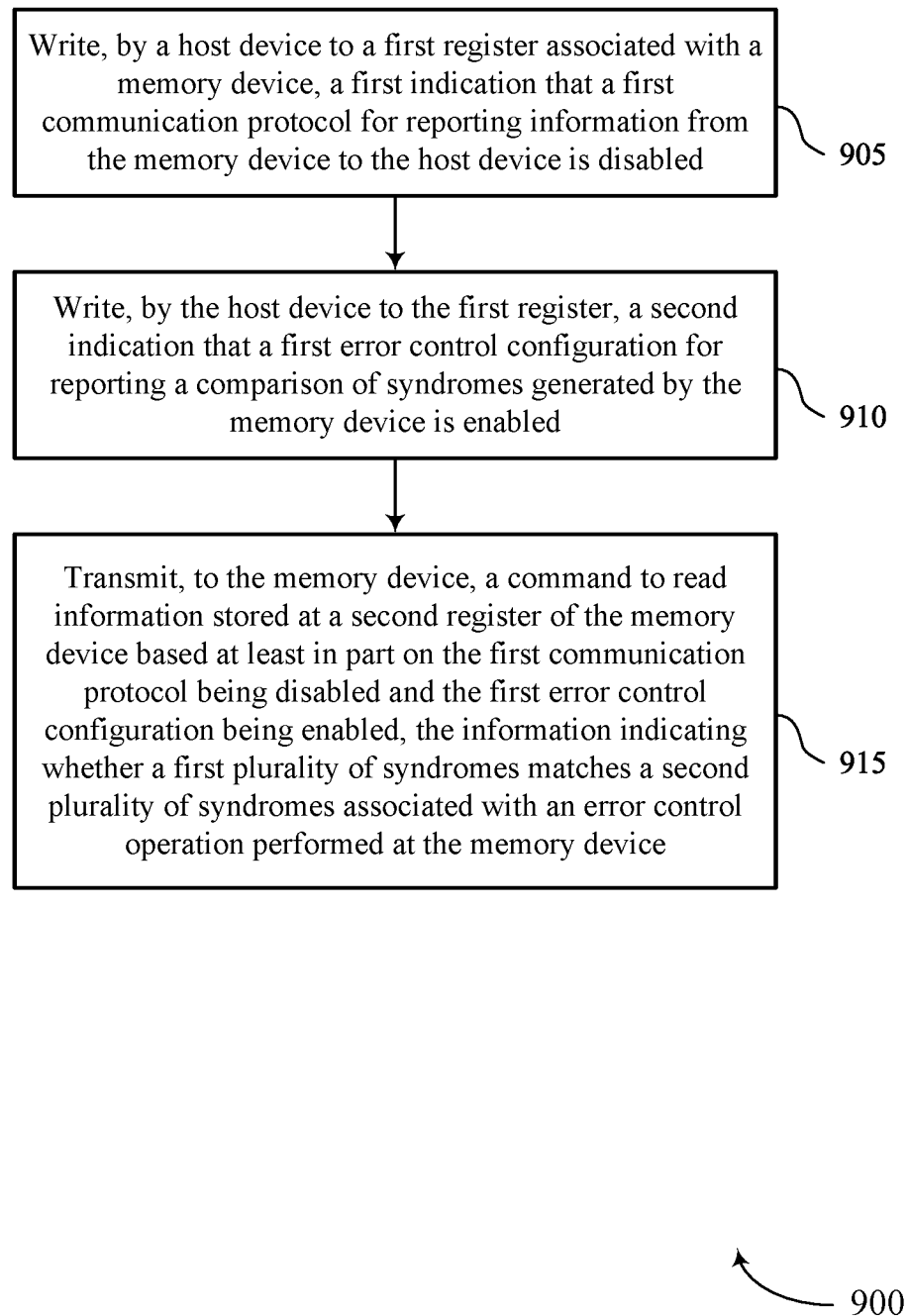

FIG. 9 shows a flowchart illustrating a method 900 that supports managing error control information using a register in accordance with examples as disclosed herein. The operations of method 900 may be implemented by a host device or its components as described herein. For example, the operations of method 900 may be performed by a host device as described with reference to FIGS. 1 through 4 and 6. In some examples, a host device may execute a set of instructions to control the functional elements of the device to perform the described functions. Additionally or alternatively, the host device may perform aspects of the described functions using special-purpose hardware.

At 905, the method may include writing, by a host device to a first register associated with a memory device, a first indication that a first communication protocol for reporting information from the memory device to the host device is disabled. The operations of 905 may be performed in accordance with examples as disclosed herein. In some examples, aspects of the operations of 905 may be performed by a memory device configuration component 625 as described with reference to FIG. 6.

At 910, the method may include writing, by the host device to the first register, a second indication that a first error control configuration for reporting a comparison of syndromes generated by the memory device is enabled. The operations of 910 may be performed in accordance with examples as disclosed herein. In some examples, aspects of the operations of 910 may be performed by a memory device configuration component 625 as described with reference to FIG. 6.

At 915, the method may include transmitting, to the memory device, a command to read information stored at a second register of the memory device based on the first communication protocol being disabled and the first error control configuration being enabled, the information indicating whether a first set of multiple syndromes matches a second set of multiple syndromes associated with an error control operation performed at the memory device. The operations of 915 may be performed in accordance with examples as disclosed herein. In some examples, aspects of the operations of 915 may be performed by a register read component 630 as described with reference to FIG. 6.

In some examples, an apparatus as described herein may perform a method or methods, such as the method 900. The apparatus may include, features, circuitry, logic, means, or instructions (e.g., a non-transitory computer-readable medium storing instructions executable by a processor) for writing, by a host device to a first register associated with a memory device, a first indication that a first communication protocol for reporting information from the memory device to the host device is disabled, writing, by the host device to the first register, a second indication that a first error control configuration for reporting a comparison of syndromes generated by the memory device is enabled, and transmitting, to the memory device, a command to read information stored at a second register of the memory device based on the first communication protocol being disabled and the first error control configuration being enabled, the information indicating whether a first set of multiple syndromes matches a second set of multiple syndromes associated with an error control operation performed at the memory device.

Some examples of the method 900 and the apparatus described herein may further include operations, features, circuitry, logic, means, or instructions for writing, by the host device to the first register of the memory device, a third indication that an operational mode of the memory device may be disabled, the operational mode including recording in an error log one or more errors associated with operation of one or more components of the memory device, where transmitting the command may be based on determining that the operational mode may be disabled.

Some examples of the method 900 and the apparatus described herein may further include operations, features, circuitry, logic, means, or instructions for determining to request, from the memory device, information indicative of a result of the error control operation, where transmitting the command may be based on determining to request the information.

It should be noted that the methods described herein describe possible implementations, and that the operations and the steps may be rearranged or otherwise modified and that other implementations are possible. Further, portions from two or more of the methods may be combined.

Another apparatus is described. The apparatus may include error control circuitry operable to perform an error control operation on data received for storage at the apparatus, the error control circuitry further operable to, generate a first set of multiple syndromes associated with the error control operation based on the received data, each syndrome of the first set including error correction or error detection syndrome bits, generate a second set of multiple syndromes associated with the error control operation based on retrieving the data, each syndrome of the second set including error correction or error detection syndrome bits, determine whether the first set of multiple syndromes matches the second set of multiple syndromes based on comparing the first set of multiple syndromes and the second set of multiple syndromes, generate a signal indicative of whether the first set of multiple syndromes matches the second set of multiple syndromes, and a register operable to receive the signal from the error control circuitry and store, at a location of the register, an indication of whether the first set of multiple syndromes matches the second set of multiple syndromes based on receiving the signal.

In some examples, the circuitry may be further operable to determine that a first communication protocol for reporting information to a host device may be disabled and determine that a first error control configuration may be enabled for reporting a comparison of syndromes generated by the apparatus according to the error control operation, where the register may be operable to receive the signal and store the indication based on determining that the first communication protocol may be disabled and the first error control configuration may be enabled.

In some examples, the apparatus may include a second register operable to store a status of the first communication protocol and a status of the first error control configuration, the circuitry operable to access the information stored at the second register to determine that the first communication protocol may be disabled and the first error control configuration may be enabled.

In some examples, the circuitry may be further operable to determine that an operational mode of the apparatus may be disabled, the operational mode including recording in an error log one or more errors associated with operation of one or more components of the apparatus, where the register may be operable to receive the signal and store the indication based on determining that the operational mode may be disabled.

In some examples, the circuitry may be further operable to determine that a second operational mode of the apparatus may be disabled, the second operational mode for indicating whether one or more data pins of the apparatus may be communicating valid data, where the register may be operable to receive the signal and store the indication based on determining that the second operational mode may be disabled.

In some examples, the circuitry may be further operable to receive, from a host device, a command for reading information stored at the register and output, to the host device, the indication based on receiving the command.

In some examples, the circuitry may be further operable to reset the information stored at the register based on receiving the command from the host device, where resetting the information includes setting the indication to a default value that indicates that different syndromes match.

In some examples, the circuitry may be further operable to receive, from a host device, a command for resetting information stored at the register and reset the information stored at the register based on receiving the command from the host device, where resetting the information includes setting the indication to a default value that indicates that different syndromes match.

In some examples of the apparatus, the register may be configured to operate in a mode selected from a set of modes, the set of modes including a first mode for reporting the indication of whether the first set of multiple syndromes matches the second set of multiple syndromes and a second mode for recording in an error log one or more errors associated with operation of one or more components of the apparatus.

In some examples of the apparatus, the indication includes one or more bits and a first value of the one or more bits indicates that each of the first set of multiple syndromes match corresponding syndromes of the second set of multiple syndromes.

In some examples of the apparatus, the indication includes one or more bits and a second value of the one or more bits indicates that at least one of the first set of multiple syndromes does not match a corresponding syndrome of the second set of multiple syndromes.

Another apparatus is described. The apparatus may include a register, circuitry operable to, determine that a first communication protocol for reporting information to a host device is enabled or disabled, determine that a first error control configuration for reporting a comparison of syndromes generated by the apparatus is enabled or disabled, and configure the register to operate in a first mode based on determining that the first communication protocol is disabled and the first error control configuration is enabled.

In some examples, the circuitry may be further operable to receive, from the host device, an indication of a status of the first communication protocol and a status of the first error control configuration and store the status of the first communication protocol and the status of the first error control configuration.

In some examples, the circuitry may be further operable to access the status of the first communication protocol and the status of the first error control configuration at the second register, where determining that the first communication protocol may be enabled and the first error control configuration may be enabled may be based on accessing the status of the first communication protocol and the status of the first error control configuration.

In some examples, the circuitry may be further operable to determine that an operational mode of the apparatus may be disabled, the operational mode including recording in an error log one or more errors associated with operation of one or more components of the apparatus, where configuring the register to operate in the first mode may be based on determining that the operational mode may be disabled.

In some examples, the circuitry may be further operable to determine that a second operational mode of the apparatus may be disabled, the second operational mode for indicating whether one or more data pins of the apparatus may be communicating valid data, where configuring the register to operate in the first mode may be based on determining that the second operational mode may be disabled.

In some examples of the apparatus, the first mode indicates a location within the register for storing one or more bits indicative of a result of an error control operation performed by the apparatus.

In some examples of the apparatus, the register may be configured to operate in a mode selected from a set of modes, the set of modes including the first mode and a second mode for recording in an error log one or more errors associated with operation of one or more components of the apparatus.

In some examples, the circuitry may be further operable to perform an error control operation operable to correct one or more errors in data stored at the apparatus, determine whether a first set of multiple syndromes associated with the error control operation matches a second set of multiple syndromes associated with the error control operation, and output, to the register and based on configuring the register to operate in the first mode, an indication of whether the first set of multiple syndromes matches the second set of multiple syndromes, where the register may be configured to store the indication based on being configured to operate in the first mode.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving, at a memory device, data for storage at the memory device;
generating, at the memory device, a first plurality of syndromes based at least in part on receiving the data for storage at the memory device, the first plurality of syndromes associated with an error control operation for the received data, each syndrome of the first plurality comprising error correction or error detection syndrome bits;
storing, at the memory device, the first plurality of syndromes based at least in part on the error control operation;
retrieving, from the memory device, the data and the first plurality of syndromes based at least in part on storing the received data and storing the first plurality of syndromes;
generating, at the memory device, a second plurality of syndromes based at least in part on retrieving the data, the second plurality of syndromes associated with the retrieved data and the error control operation, each syndrome of the second plurality comprising error correction or error detection syndrome bits;
determining whether the first plurality of syndromes matches the second plurality of syndromes based at least in part on comparing the first plurality of syndromes and the second plurality of syndromes; and
storing, at a register of the memory device, an indication of whether the first plurality of syndromes matches the second plurality of syndromes.

2. The method of claim 1, further comprising:
determining that a first communication protocol for reporting information to a host device is disabled; and
determining that a first error control configuration is enabled for reporting a comparison of syndromes generated by the memory device according to the error control operation, wherein storing the indication at the register is based at least in part on determining that the first communication protocol is disabled and the first error control configuration is enabled.

3. The method of claim 2, further comprising:
accessing a second register of the memory device that stores a status of the first communication protocol and a status of the first error control configuration, wherein determining that the first communication protocol is disabled and the first error control configuration is enabled is based at least in part on accessing the second register.

4. The method of claim 2, further comprising:
determining that an operational mode of the memory device is disabled, the operational mode comprising recording in an error log one or more errors associated with operation of one or more components of the memory device, wherein storing the indication at the register is based at least in part on determining that the operational mode is disabled.

5. The method of claim 2, further comprising:
determining that a second operational mode of the memory device is disabled, the second operational mode for indicating whether one or more data pins of the memory device are communicating valid data, wherein storing the indication at the register is based at least in part on determining that the second operational mode is disabled.

6. The method of claim 1, further comprising:
receiving, from a host device, a command for reading information stored at the register; and
outputting, to the host device, the indication based at least in part on receiving the command.

7. The method of claim 6, further comprising:
resetting the information stored at the register based at least in part on receiving the command from the host device, wherein resetting the information comprises setting the indication to a default value that indicates that different syndromes match.

8. The method of claim 1, further comprising:
receiving, from a host device, a command for resetting information stored at the register; and
resetting the information stored at the register based at least in part on receiving the command from the host device, wherein resetting the information comprises setting the indication to a default value that indicates that different syndromes match.

9. The method of claim 1, wherein the register is configured to operate in a mode selected from a set of modes, the set of modes comprising a first mode for reporting the indication of whether the first plurality of syndromes matches the second plurality of syndromes and a second mode for recording in an error log one or more errors associated with operation of one or more components of the memory device.

10. The method of claim 1, wherein the indication comprises one or more bits and a value of the one or more bits indicates that each of the first plurality of syndromes match corresponding syndromes of the second plurality of syndromes.

11. The method of claim 1, wherein the indication comprises one or more bits and a value of the one or more bits indicates that at least one of the first plurality of syndromes does not match a corresponding syndrome of the second plurality of syndromes.

12. An apparatus, comprising:
error control circuitry operable to perform an error control operation on data received for storage at the apparatus, the error control circuitry further operable to:
generate a first plurality of syndromes associated with the error control operation based at least in part on the received data, each syndrome of the first plurality comprising error correction or error detection syndrome bits;
store the first plurality of syndromes based at least in part on the error control operation;
retrieve the data and the first plurality of syndromes based at least in part on storing the received data and storing the first plurality of syndromes;
generate a second plurality of syndromes associated with the error control operation based at least in part on retrieving the data, each syndrome of the second plurality comprising error correction or error detection syndrome bits;

determine whether the first plurality of syndromes matches the second plurality of syndromes based at least in part on comparing the first plurality of syndromes and the second plurality of syndromes; and
generate a signal indicative of whether the first plurality of syndromes matches the second plurality of syndromes; and
a register operable to receive the signal from the error control circuitry and store, at a location of the register, an indication of whether the first plurality of syndromes matches the second plurality of syndromes based at least in part on receiving the signal.

13. The apparatus of claim 12, wherein the apparatus further comprises circuitry operable to:
determine that a first communication protocol for reporting information to a host device is disabled; and
determine that a first error control configuration is enabled for reporting a comparison of syndromes generated by the apparatus according to the error control operation, wherein the register is operable to receive the signal and store the indication based at least in part on determining that the first communication protocol is disabled and the first error control configuration is enabled.

14. The apparatus of claim 13, further comprising:
a second register operable to store a status of the first communication protocol and a status of the first error control configuration, the circuitry operable to access the information stored at the second register to determine that the first communication protocol is disabled and the first error control configuration is enabled.

15. The apparatus of claim 13, wherein the circuitry is further operable to:
determine that an operational mode of the apparatus is disabled, the operational mode comprising recording in an error log one or more errors associated with operation of one or more components of the apparatus, wherein the register is operable to receive the signal and store the indication based at least in part on determining that the operational mode is disabled.

16. The apparatus of claim 13, wherein the circuitry is further operable to:
determine that a second operational mode of the apparatus is disabled, the second operational mode for indicating whether one or more data pins of the apparatus are communicating valid data, wherein the register is operable to receive the signal and store the indication based at least in part on determining that the second operational mode is disabled.

17. The apparatus of claim 12, wherein the register is further operable to:
receive, from a host device, a command for reading information stored at the register; and
output, to the host device, the indication based at least in part on receiving the command.

18. The apparatus of claim 12, wherein the register is further operable to:
receive, from a host device, a command for resetting information stored at the register; and
reset the information stored at the register based at least in part on receiving the command from the host device, wherein resetting the information comprises setting the indication to a default value that indicates that different syndromes match.

19. The apparatus of claim 12, wherein the register is configured to operate in a mode selected from a set of modes, the set of modes comprising a first mode for reporting the indication of whether the first plurality of syndromes matches the second plurality of syndromes and a second mode for recording in an error log one or more errors associated with operation of one or more components of the apparatus.

\* \* \* \* \*